(12) United States Patent
Taylor

(10) Patent No.: US 8,307,996 B2
(45) Date of Patent: Nov. 13, 2012

(54) FRAME WITH CABLE MANAGEMENT

(75) Inventor: Chris Taylor, Cheltenham Glos (GB)

(73) Assignee: ADC GmbH, Berlin (DE)

( * ) Notice: Subject to any disclaimer, the term of this patent is extended or adjusted under 35 U.S.C. 154(b) by 446 days.

(21) Appl. No.: 12/547,775

(22) Filed: Aug. 26, 2009

(65) Prior Publication Data
US 2010/0133391 A1 Jun. 3, 2010

Related U.S. Application Data

(60) Provisional application No. 61/094,597, filed on Sep. 5, 2008.

(51) Int. Cl.
A47F 7/00 (2006.01)

(52) U.S. Cl. ........................................................ 211/26

(58) Field of Classification Search ................ 211/26, 211/66, 70.6, 87.01, 183, 189; 248/58, 59, 248/62, 68.1, 69, 74.1; 312/265.1–265.6, 312/223.1
See application file for complete search history.

(56) References Cited

U.S. PATENT DOCUMENTS

| | | | | |
|---|---|---|---|---|
| 1,206,655 A * | 11/1916 | Belcher | ........................... | 248/113 |
| 2,488,664 A * | 11/1949 | Gruber | ........................... | 211/60.1 |
| 3,482,203 A * | 12/1969 | Whitright | ..................... | 439/528 |
| 4,749,160 A * | 6/1988 | Shih | ............................. | 248/316.1 |
| 6,129,316 A * | 10/2000 | Bauer | ........................... | 248/68.1 |
| 6,215,069 B1 * | 4/2001 | Martin et al. | ................ | 174/68.3 |
| 6,468,112 B1 * | 10/2002 | Follingstad et al. | .......... | 439/719 |
| 6,613,981 B1 * | 9/2003 | Hathcock et al. | ............... | 174/69 |
| 6,629,675 B1 * | 10/2003 | Bjorklund et al. | .............. | 248/49 |
| 6,819,857 B2 * | 11/2004 | Douglas et al. | ............... | 385/135 |
| 6,918,796 B2 | 7/2005 | Elliot et al. | | |
| 6,964,588 B2 | 11/2005 | Follingstad et al. | | |
| 7,083,051 B2 | 8/2006 | Smith et al. | | |
| 7,220,150 B2 | 5/2007 | Follingstad et al. | | |
| 7,331,473 B2 | 2/2008 | Smith et al. | | |
| 7,362,941 B2 * | 4/2008 | Rinderer et al. | ............. | 385/134 |
| 7,381,100 B2 | 6/2008 | Follingstad et al. | | |
| 7,513,374 B2 | 4/2009 | Smith et al. | | |
| 7,527,157 B2 * | 5/2009 | Shinn et al. | ................. | 211/89.01 |
| 7,562,779 B2 * | 7/2009 | Bravo et al. | ..................... | 211/26 |

(Continued)

FOREIGN PATENT DOCUMENTS

DE 100 05 102 A1 8/2001

(Continued)

OTHER PUBLICATIONS

International Search Report mailed Feb. 10, 2010 (5 pages).

(Continued)

*Primary Examiner* — Jennifer E. Novosad
(74) *Attorney, Agent, or Firm* — Merchant & Gould P.C.

(57) ABSTRACT

A cable management frame assembly comprising a collapsible frame chassis and a plurality of positionally configurable cable management fixtures that can be affixed to the frame chassis without the use of tools or additional hardware such screws, nuts or bolts. A panel mount allows patch panels and equipment to be mounted to the frame chassis without the use of tools or additional hardware.

15 Claims, 36 Drawing Sheets

U.S. PATENT DOCUMENTS

| | | | |
|---|---|---|---|
| 7,600,720 B2 * | 10/2009 | Vogel et al. | 248/49 |
| 7,677,400 B2 | 3/2010 | Bayazit et al. | |
| RE41,353 E * | 5/2010 | McGrath et al. | 385/134 |
| 7,748,541 B2 | 7/2010 | Smith et al. | |
| 7,973,242 B2 * | 7/2011 | Jones et al. | 174/100 |
| RE42,970 E * | 11/2011 | Fournier et al. | 211/26 |
| 8,119,915 B2 * | 2/2012 | Regester et al. | 174/100 |
| 2002/0170726 A1 | 11/2002 | Mendoza | |
| 2004/0050808 A1 * | 3/2004 | Krampotich et al. | 211/26 |
| 2009/0091909 A1 | 4/2009 | Follingstad et al. | |
| 2010/0078529 A1 | 4/2010 | Taylor | |
| 2010/0080512 A1 | 4/2010 | Taylor et al. | |
| 2010/0166378 A1 | 7/2010 | Taylor | |

FOREIGN PATENT DOCUMENTS

| | | |
|---|---|---|
| EP | 0 871 047 A1 | 10/1998 |
| EP | 1 160 605 A2 | 12/2001 |

OTHER PUBLICATIONS

International Preliminary Report on Patentability mailed Mar. 8, 2011 (9 pages).

U.S. Appl. No. 12/657,613, filed Jan. 21, 2010.

* cited by examiner

FRAME WITH CABLE MANAGEMENT

CROSS REFERENCE TO RELATED APPLICATION

This application claims the benefit of provisional application Ser. No. 61/094,597, filed Sep. 5, 2008, which is incorporated herein by reference in its entirety.

BACKGROUND

The present disclosure relates generally to telecommunications cable management systems. More specifically, the present disclosure relates to cable management frame assemblies for arranging and organizing cables and for holding telecommunications equipment.

Cable management systems and assemblies are commonly used in the telecommunications industry to guide, secure and position cables such that the cables do not interfere with each other or with other equipment.

The telecommunications industry is driven to provide cable management assemblies that provide the most effective cable management solutions as it is typically difficult and time consuming to perform installation and/or maintenance work in an environment containing numerous cables and equipment or environments with confined spaces.

For these and other reasons cable management assemblies are desired such that cables can be efficiently organized and positioned.

SUMMARY

Cable management frame assemblies in accordance with the principles of the present disclosure include a frame chassis and a plurality of cable management fixtures that can be affixed to the frame chassis. The cable management frame assembly is arranged wherein the fixtures are placed as desired to optimally guide, secure and position cables such that the cables do not interfere with each other or with other equipment. In a preferred embodiment, the cable management fixtures are mounted to the frame chassis without the use of tools or additional hardware such screws, nuts or bolts. In the preferred embodiment, at least some of the cable management fixtures are positionally configurable to adjust for spacing and volume of cable. It will be appreciated the cables can be a single cable or a bundle of cables and can be of many different types, such as a fiber optic cable, an electrical conductor, or other cable. In a preferred embodiment, the cable management fixtures are mounted to the frame chassis such that the fixtures are removable and/or retractable.

Cable management systems in accordance with the principles of the present disclosure include a frame chassis with top and bottom sections, and first and second sides pivotally connected to form the frame chassis, wherein the frame chassis is assembled from a collapsed position to an erected position by pivoting the sections and sides relative to one another. Locking structure locks the frame chassis in the erected position. Preferably, the frame chassis is assembled to the erected position and locked in the erected position without the use of tools or additional hardware such as screws, nuts or bolts.

Panel mount and frame assemblies in accordance with the principles of the present disclosure include a slide mount to connect panels to the frame without the use of tools or additional hardware such as screws, nuts or bolts.

DESCRIPTION OF THE DRAWINGS

Aspects of the disclosure may be more completely understood in consideration of the following detailed description of various embodiments of the disclosure in connection with the accompanying drawings, in which.

DETAILED DESCRIPTION

The following embodiments described in this document are provided by way of illustration only and should not be construed as limiting. Various modifications and changes may be made to the example embodiments described below without departing from the true spirit and scope of the disclosure.

Figure 1:
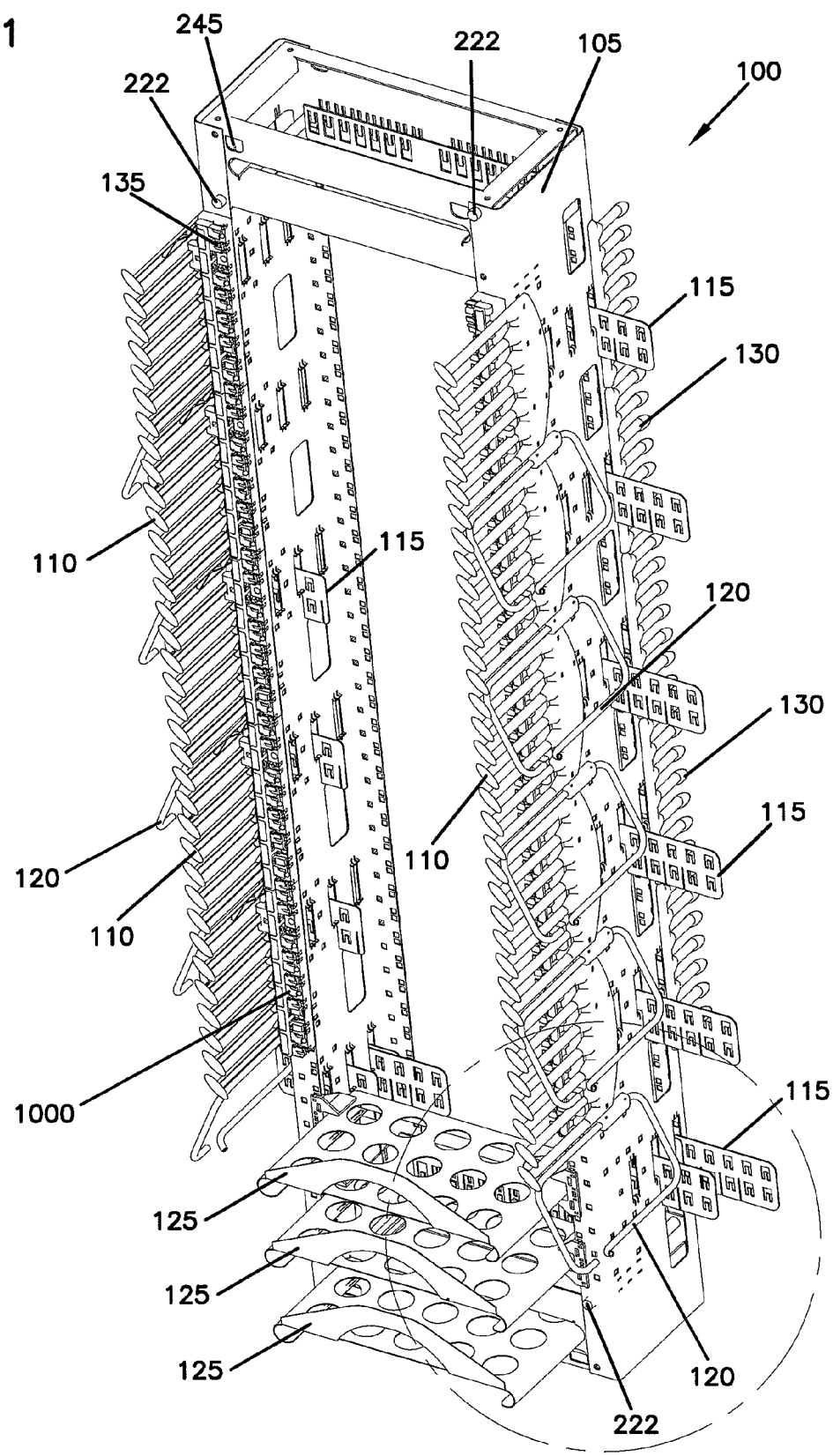
FIG. 1 is a perspective view of an example cable management frame assembly.

FIG. 1 illustrates a preferred embodiment of an example cable management frame assembly 100 having features in accordance with the principles of the present disclosure. The cable management frame assembly 100 includes a frame chassis 105 and a plurality of cable management fixtures for managing cables extending to and from the frame chassis 105. In the preferred embodiment, the cable management frame assembly 100 includes a plurality of positionally configurable cable management fixtures.

Example cable management fixtures include, in part, a patch cable finger unit 110, a cable management plate 115, a cable constraint bar 120, a cable management tray 125, a cable guide finger unit 130, and a panel mount 1000, as described in further detail below.

Figure 2:
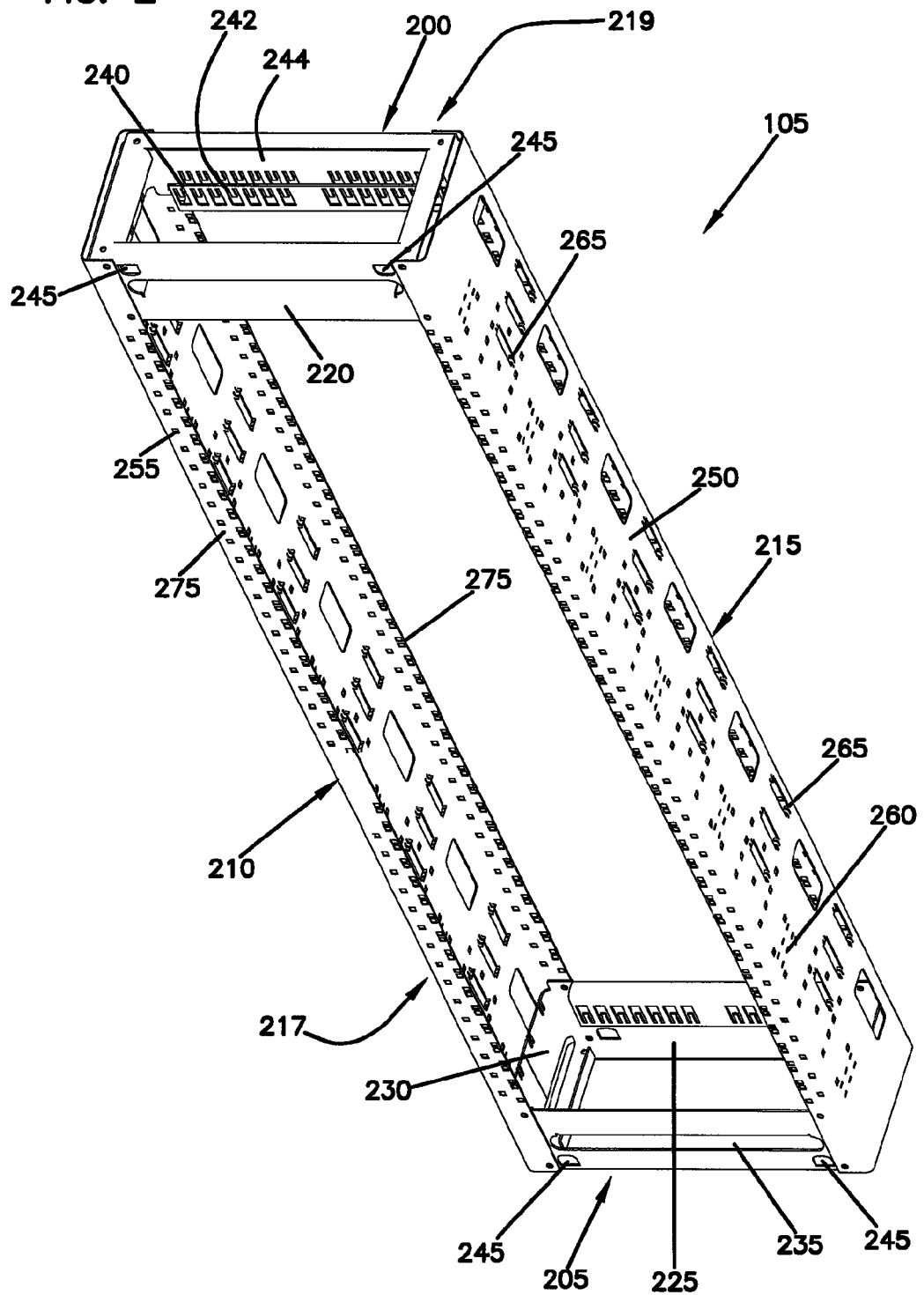
FIG. 2 is a perspective view of a frame chassis.
Figure 3:
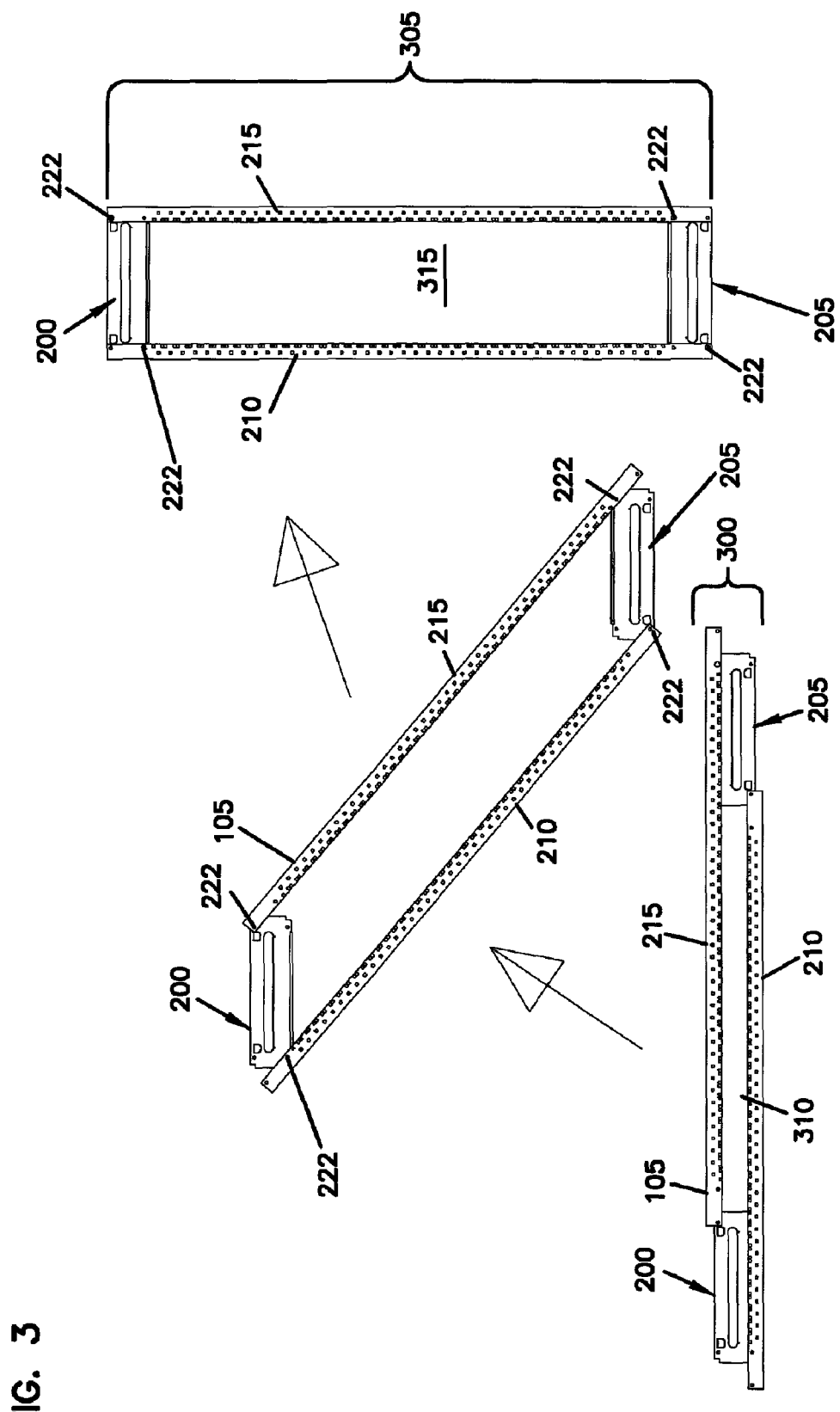
FIG. 3 is front views of a frame chassis positioned in a collapsed position, an intermediate position, and an erected position.

Referring now to FIGS. 1-3, the frame chassis 105 forms the frame structure of the cable management frame assembly 100. The frame chassis 105 includes a top section 200, a bottom section 205, a first post or side 210, and a second post or side 215, and has a front side 217 and a rear side 219. The top section 200 and the bottom section 205 are formed having the same general physical dimensions. Each respective section 200, 205 is generally rectangular in shape and includes a front plate 220, a rear plate 225, and a pair of side plates 230. The front plate 220 includes an elongated positioning aperture 235. The rear plate 225 has front and rear plate portions 242, 244. The rear plate 225 has a plurality of cable positioning tab apertures 240 positioned on plate portions 242, 244 that can be utilized as cable tie locations to secure or provide strain relief for one or more cables. Side plates 230 join the front plate 220 to the rear plate 225. Preferably, the top section 200 and the bottom section 205 are identically configured components, for manufacturing ease.

Both plates 220, 225 include a plurality of U-shaped apertures 245. In certain embodiments, U-shaped apertures 245 are utilized to pass a stabilizing element between front side 217 and a rear side 219 to stabilize frame chassis 105 positioned in an upright position. In one embodiment, stabilizing element comprises of a bar passing between front side 217 and a rear side 219 and a base element attached to bar for stabilization.

The first side 210 and the second side 215 are formed having the same general physical dimensions. Sides 210, 215 include a primary surface 250 having a plurality of spaced apertures. In general, the plurality of apertures are formed having one or more distinguishable shapes such that one or more different types of cable management fixtures can be fastened to the frame chassis 105. In the example embodiment, apertures defined on the primary surface 250 include a square aperture 255, a slit aperture 260, and a slot aperture 265. As described in further detail below, each of the respective apertures 255, 260, and 265 are periodically spaced and shaped such that corresponding cable management fixtures can be optimally positioned to the frame chassis 105. The slot aperture 265 includes curved tabs 261 to restrict movement of a respective cable management fixture, described in further detail below.

Sides 210, 215 additionally include a secondary surface 275 formed as a lip section running along both of the lengthwise edges of a respective side 210, 215. In this manner, sides 210, 215 form a U-shaped cross-section. In general, each respective secondary surface 275 includes plurality of periodically spaced apertures shaped such that one or more different types of cable management fixtures can be secured to the frame chassis 105. In the example embodiment, apertures defined on the secondary surface 275 include square apertures 255. Preferably, the sides 210, 215 are identically configured components, for manufacturing ease.

In one example embodiment, the top section 200, bottom section 205, first side 210 and second side 215 are pivotally connected at pivots 222 to form the frame chassis 105. In one aspect, the frame chassis 105 is collapsible. As such, the frame chassis 105 can be positioned from a collapsed position 300 to an erected position 305. In the collapsed position 300 the frame chassis 105 is folded such that the top section 200, bottom section 205, first side 210 and second side 215 have the respective lengthwise surfaces in parallel planes. In this manner, a storage void space 310 framed by the first side 210 and the second side 215 can be utilized to store one or more different types of cable management fixtures or other items.

In one aspect, the frame chassis 105 is supplied in the collapsed position 300 and then is positioned into an erected position 305 by pivoting the sections about the various pivot points, in a parallelogram action. Subsequently, the frame chassis 105 can be locked to maintain the erected position 305. For example, the erected frame assembly can be secured in the erected position 305 by a clamping fixture such as one or more rotating clamp handles. In the erected position 305 the frame chassis 105 defines a space 315 where equipment can be mounted. In use, the frame chassis 105 is erected, locked and bolted to the floor.

Figure 4:
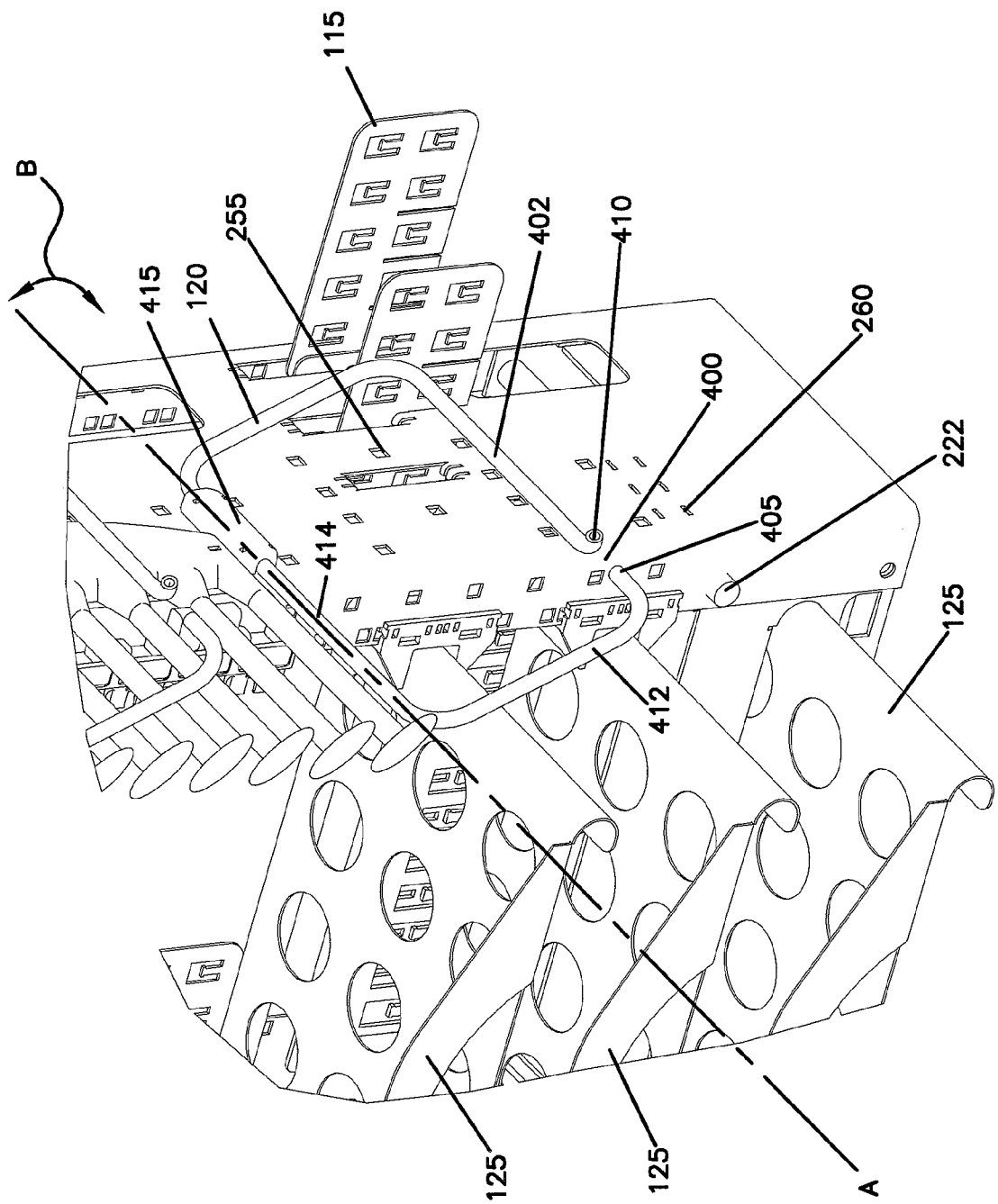
FIG. 4 is a perspective view of a bottom portion of the example cable management frame assembly of FIG. 1.
Figure 5:
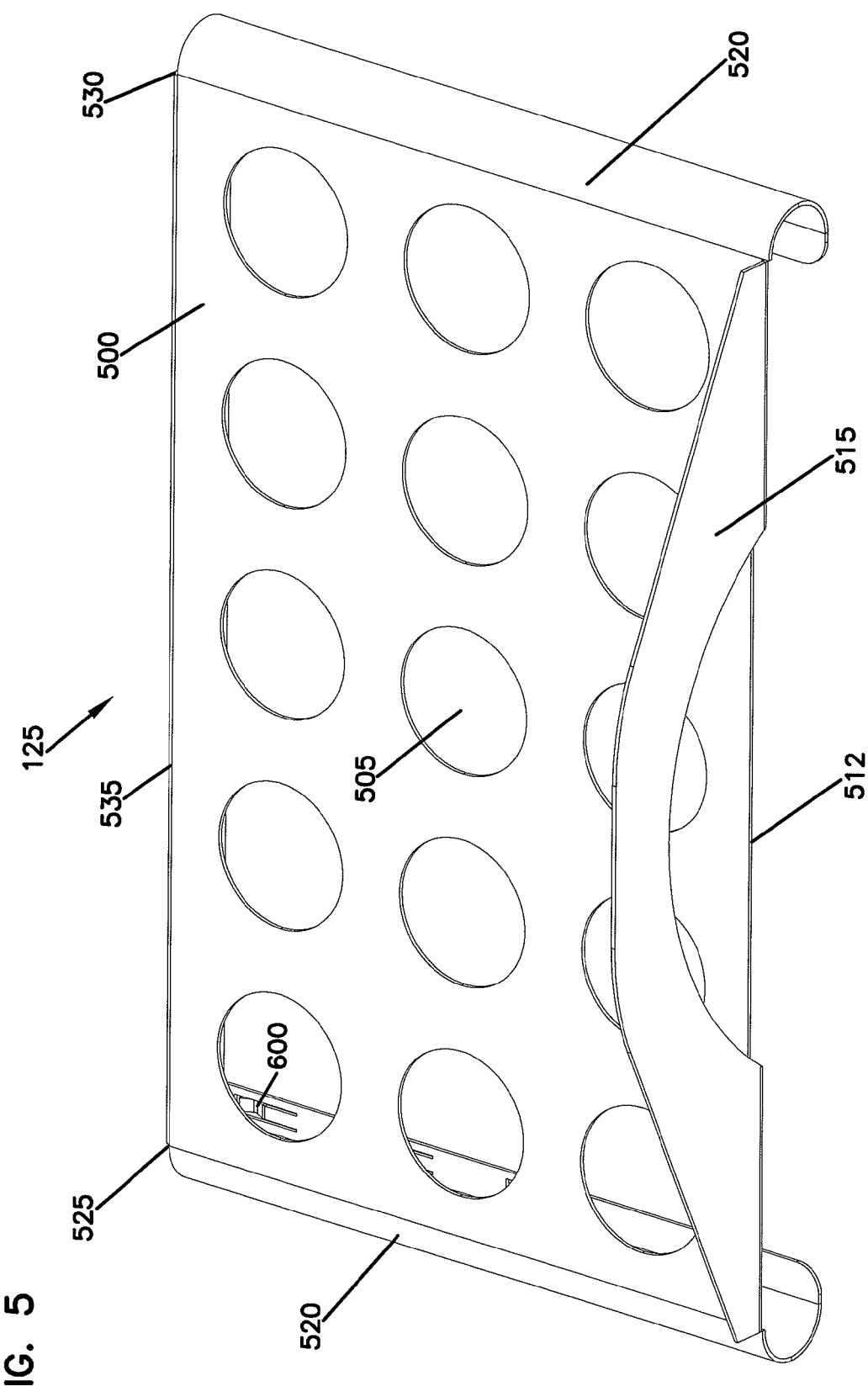
FIG. 5 is a perspective view of a cable management tray.
Figure 6:
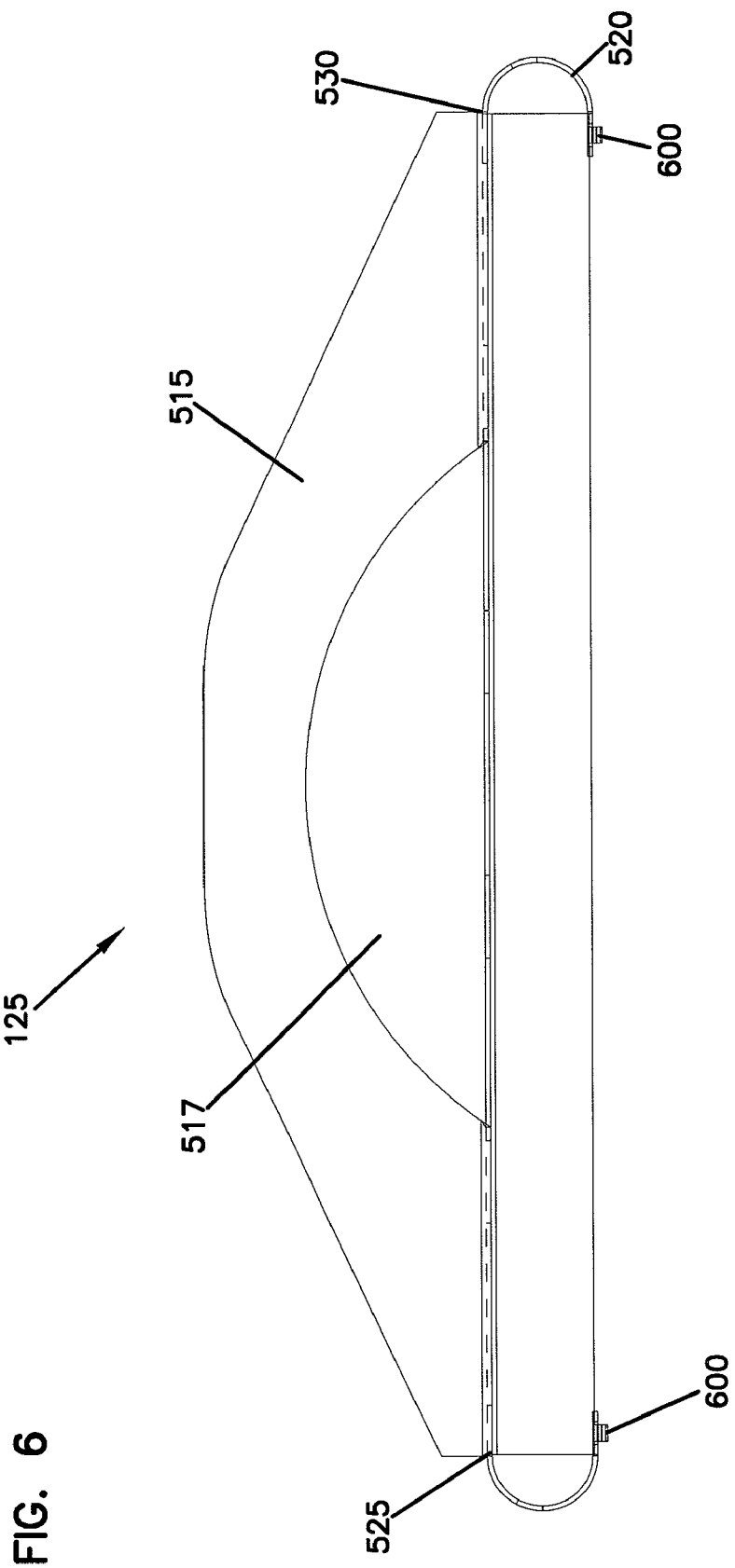
FIG. 6 is a front view of the cable management tray of FIG. 5.
Figure 7:
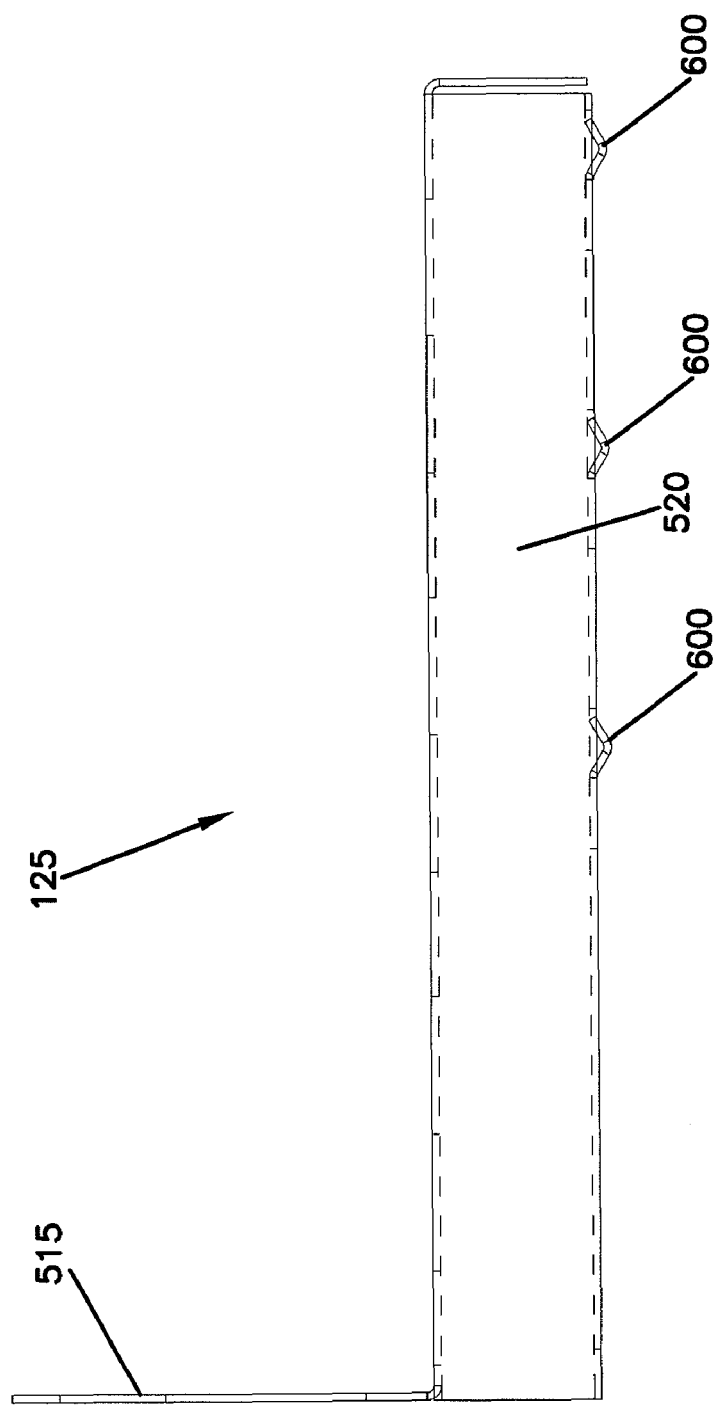
FIG. 7 is a side view of the cable management tray of FIG. 5.
Figure 8:
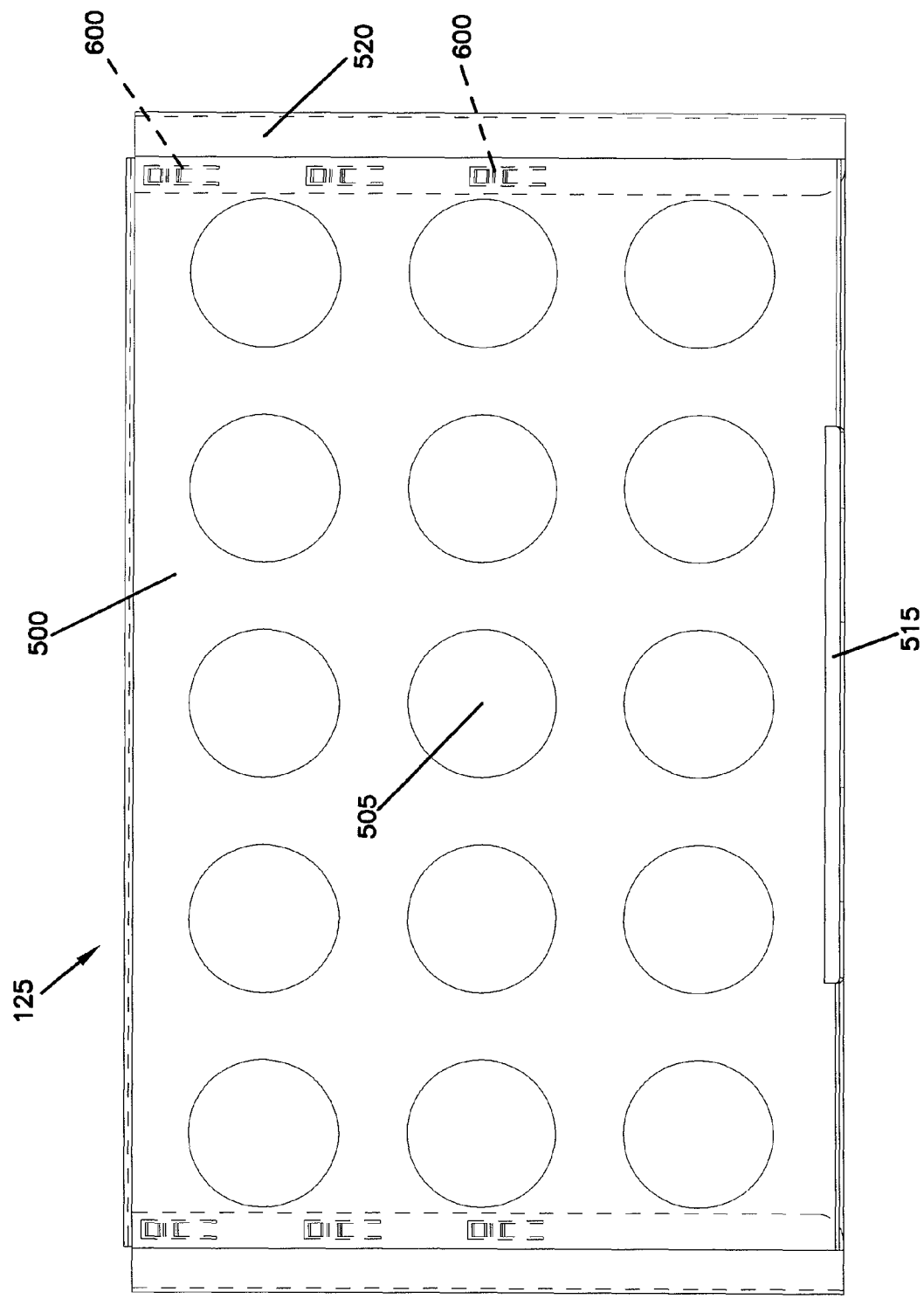
FIG. 8 is a top view of the cable management tray of FIG. 5.
Figure 9:
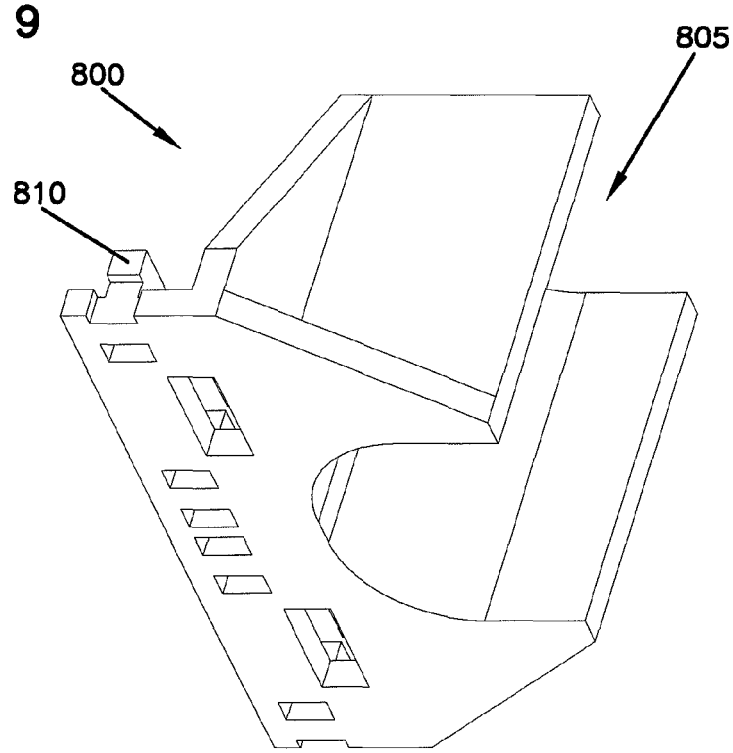
FIG. 9 is a perspective view of a horizontal tray support.
Figure 10:
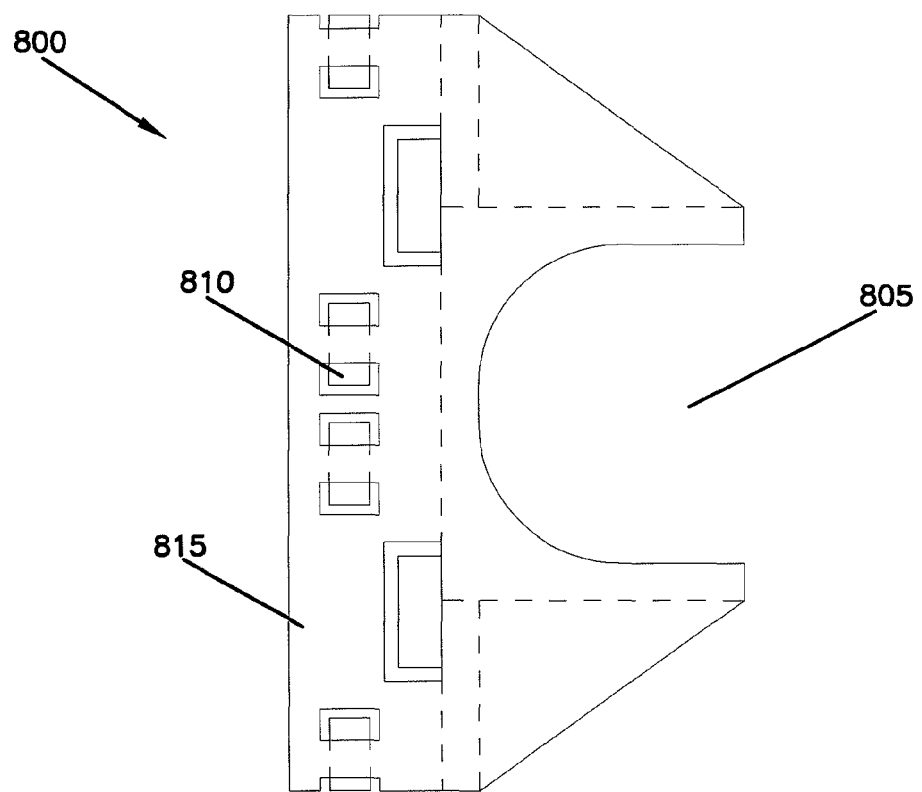
FIG. 10 is a front view of the horizontal tray support of FIG. 9.
Figure 11:
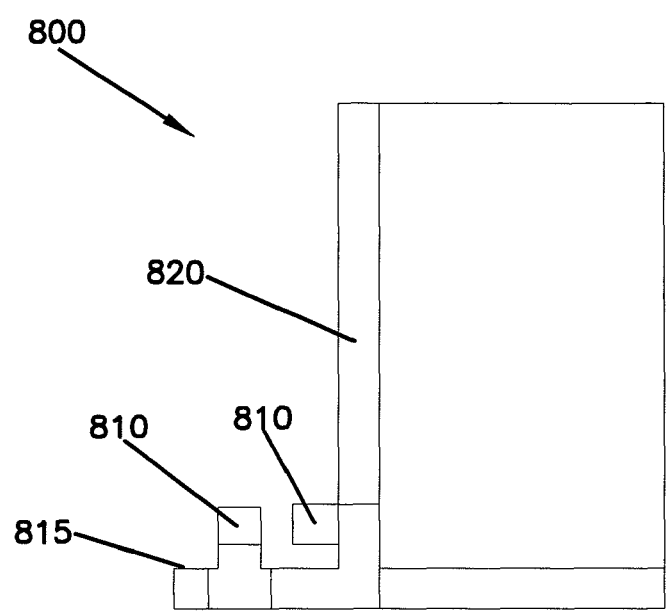
FIG. 11 is a top view of the horizontal tray support of FIG. 9.
Figure 12:
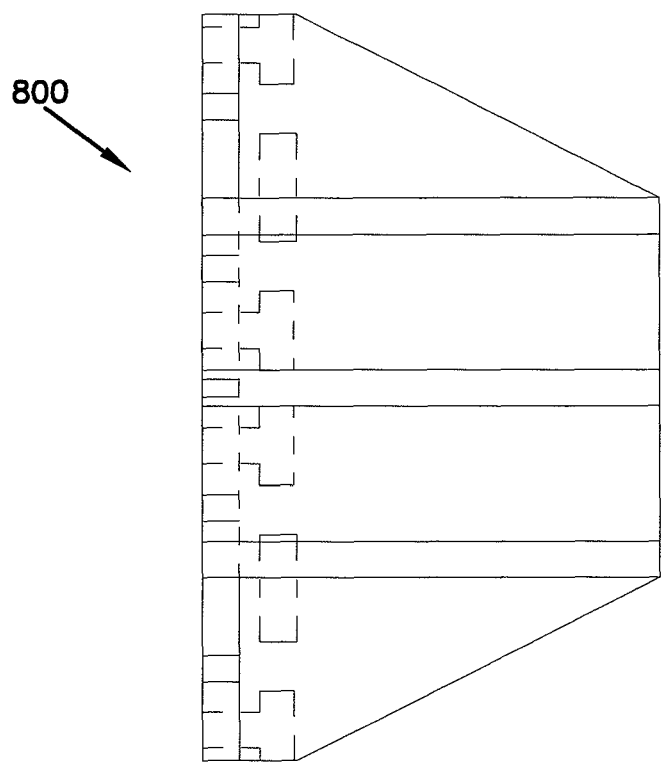
FIG. 12 is a side view of the horizontal tray support of FIG. 9.
Figure 13:
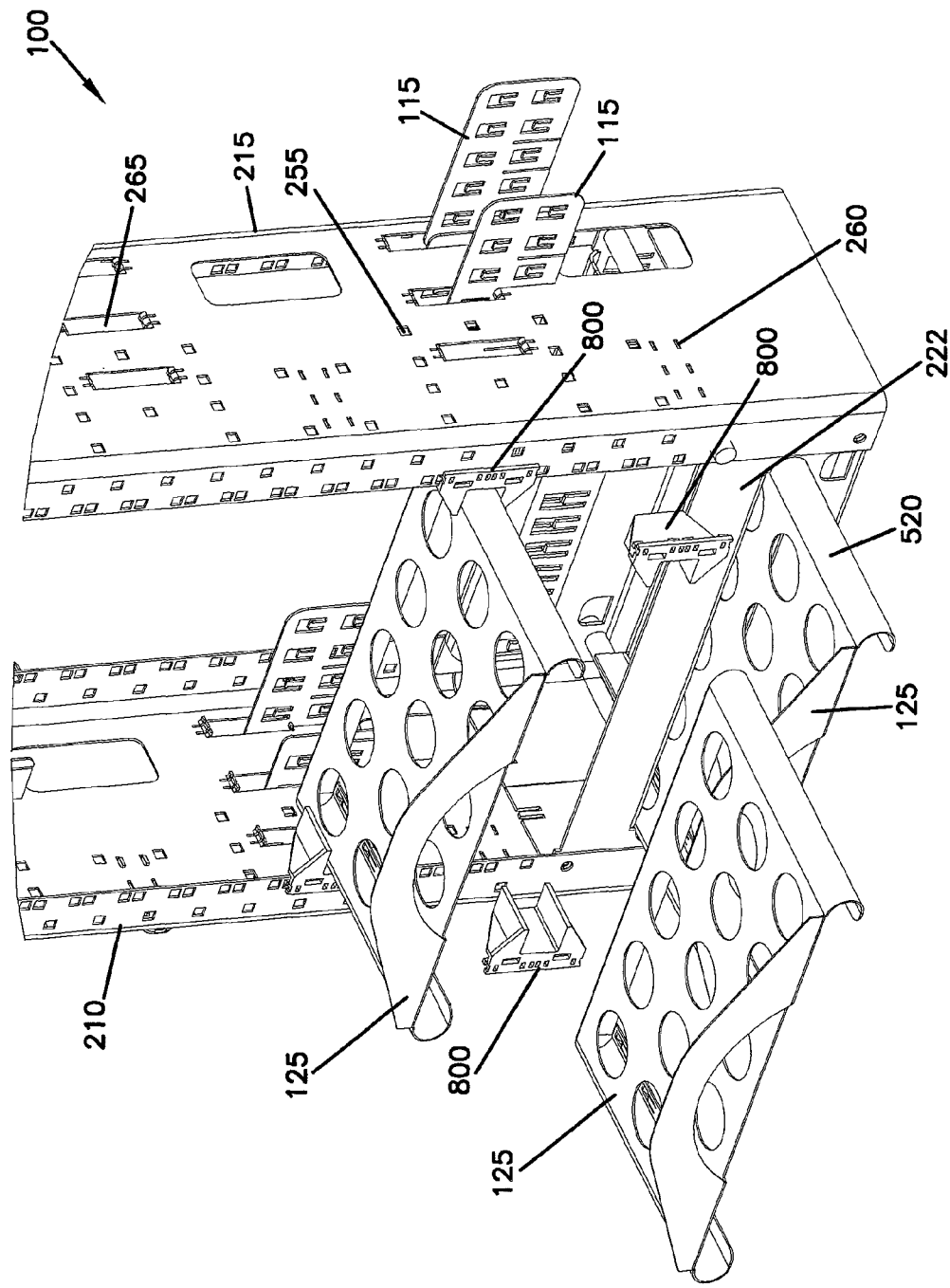
FIG. 13 is a further perspective view of a bottom portion of the example cable management frame assembly of FIG. 1, showing portions in exploded view.
Figure 14:
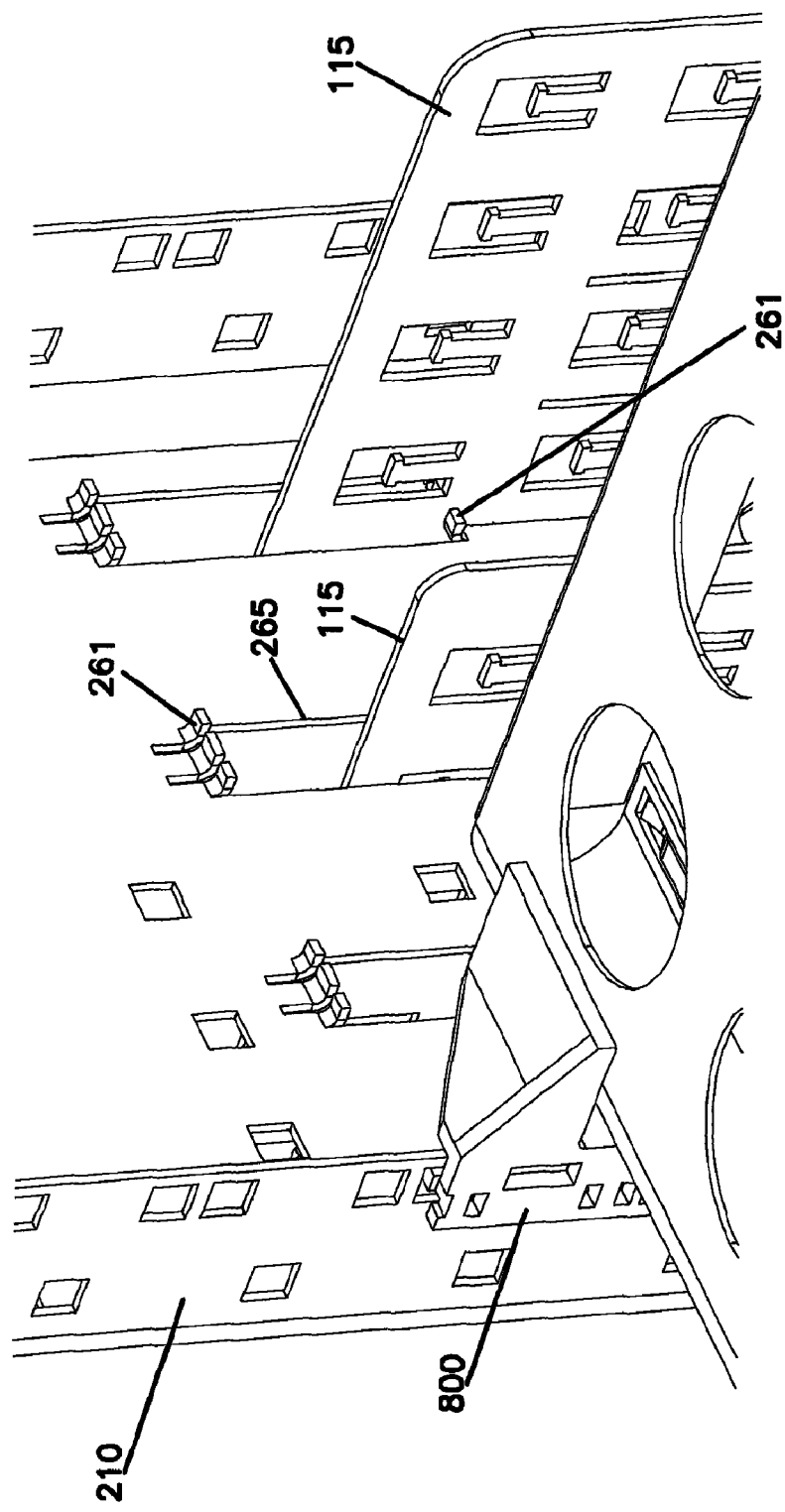
FIG. 14 is an enlarged view of a portion of the frame assembly of FIG. 13.
Figure 15:
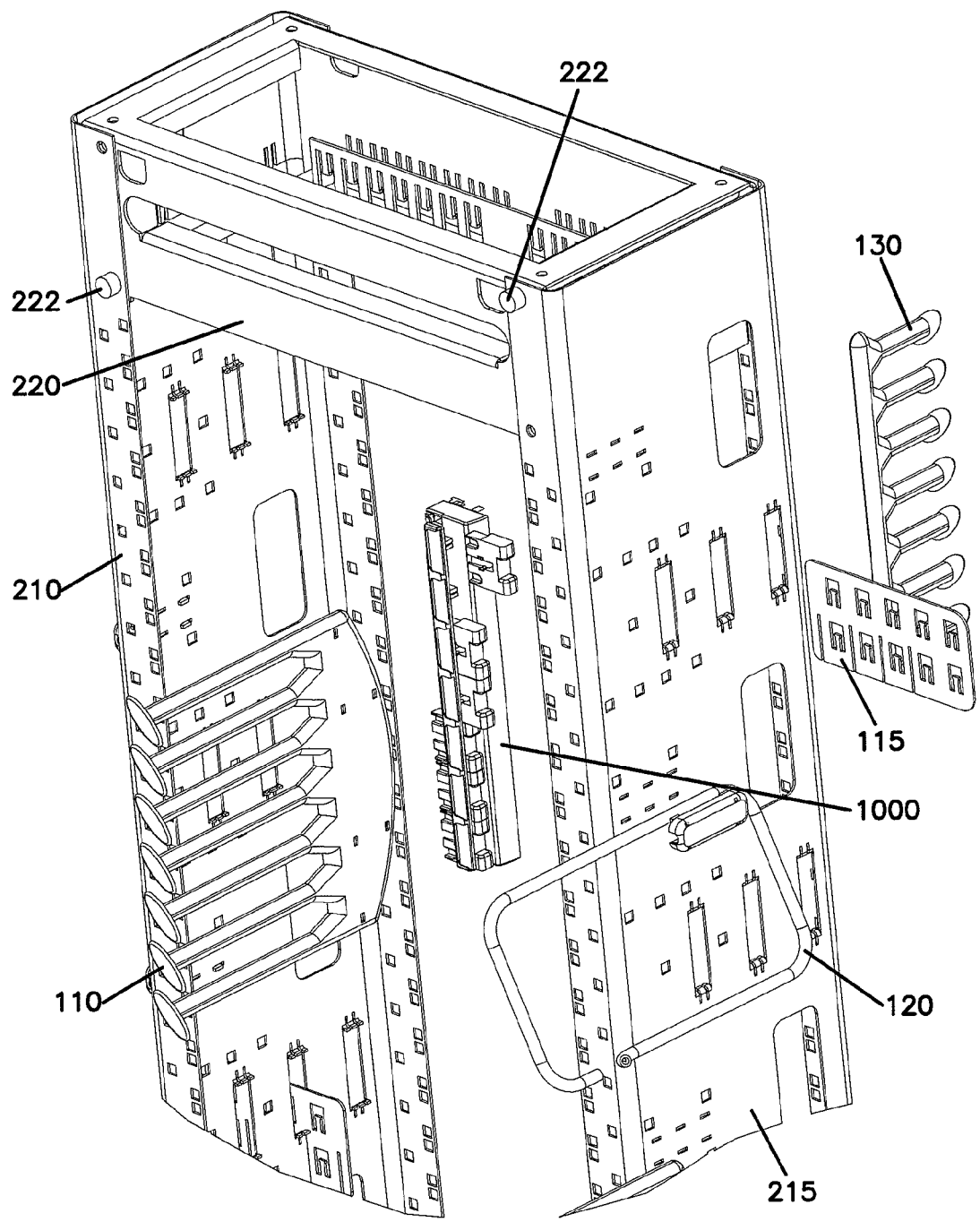
FIG. 15 is a perspective view of a top portion of the example cable management frame assembly of FIG. 1, showing portions in exploded view.
Figure 16:
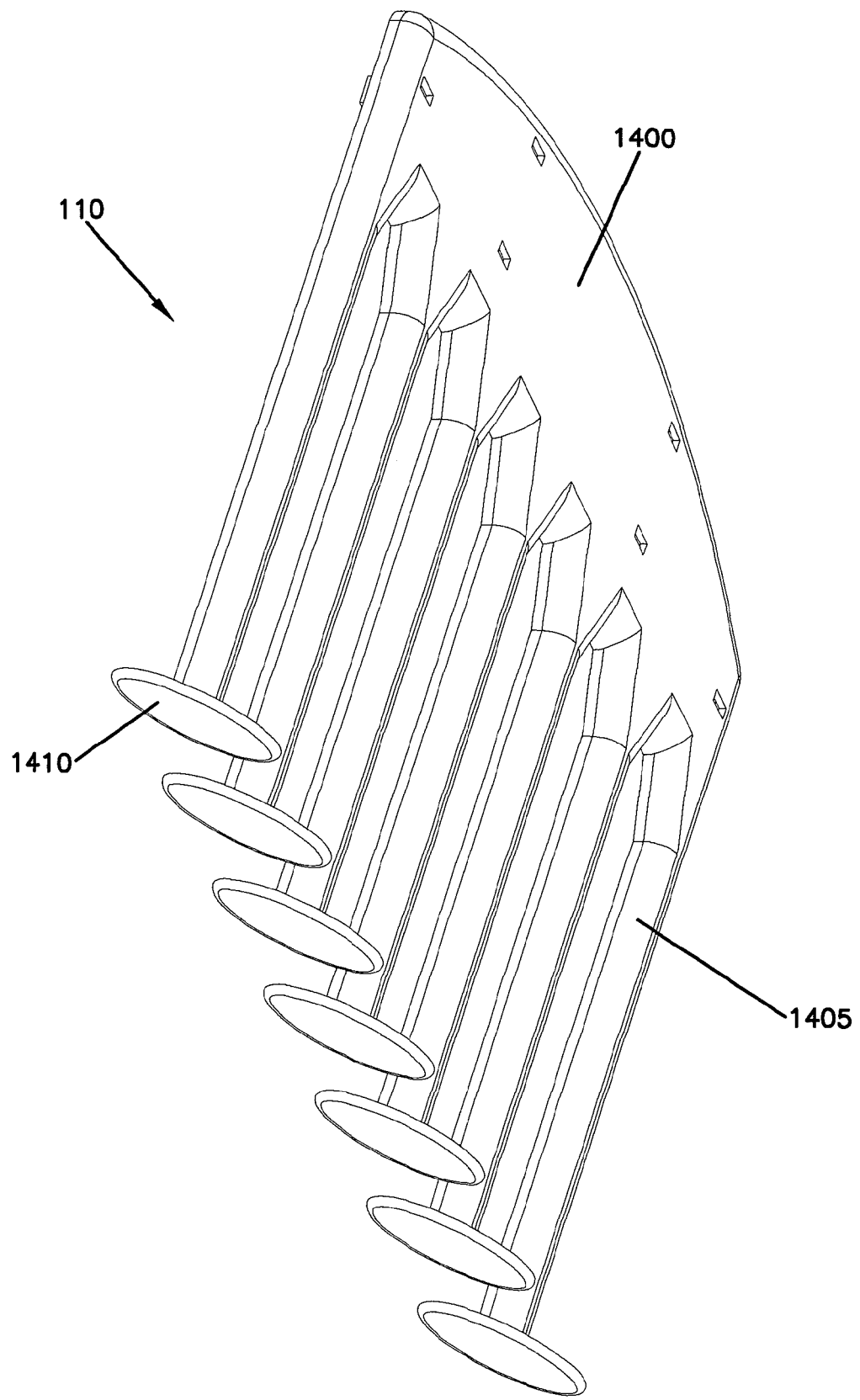
FIG. 16 is a perspective view of a patch cable finger unit.
Figure 17:
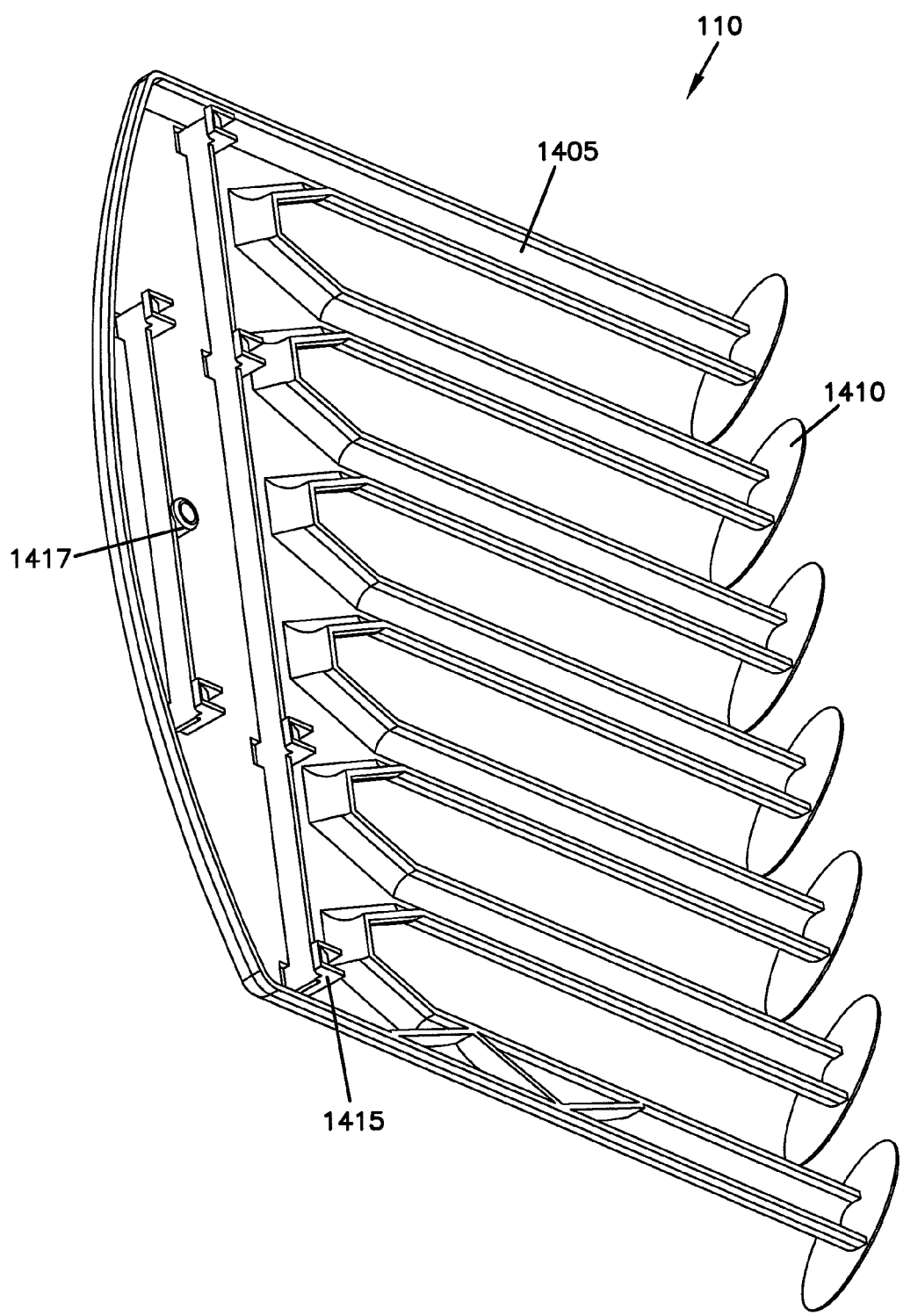
FIG. 17 is a further perspective view of the patch cable finger unit of FIG. 16.
Figure 18:
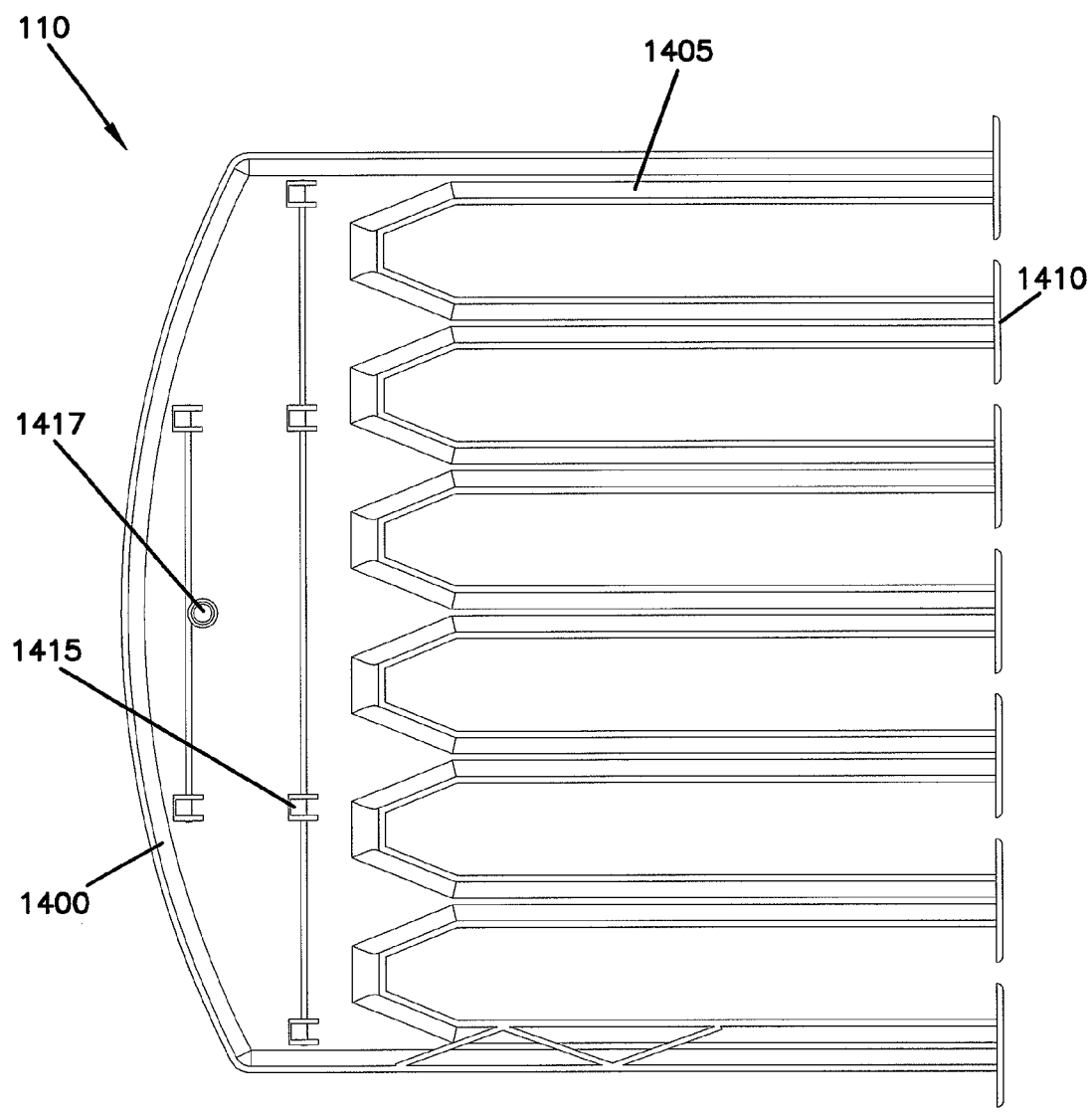
FIG. 18 is a first side view of the patch cable finger unit of FIG. 16.
Figure 19:
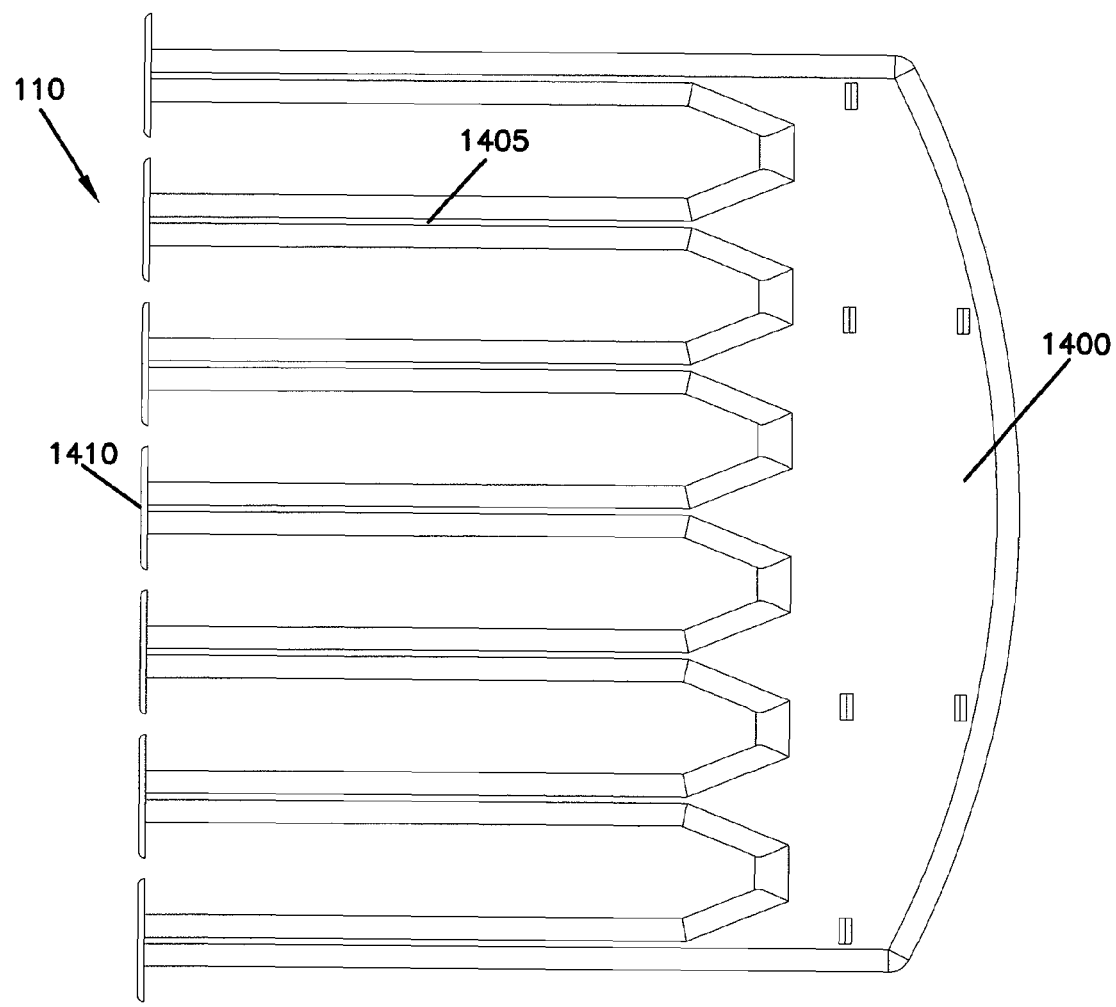
FIG. 19 is an opposite side view of the patch cable finger unit of FIG. 16.
Figure 20:
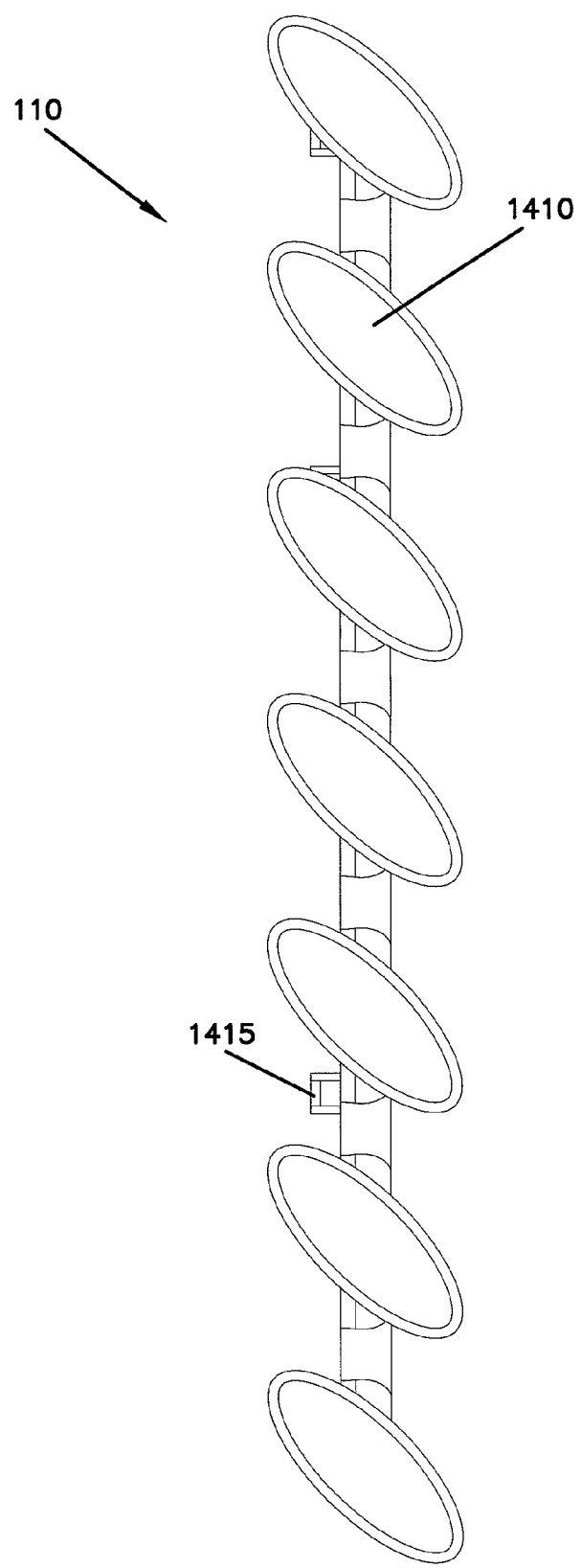
FIG. 20 is a front view of the patch cable finger unit of FIG. 16.
Figure 21:
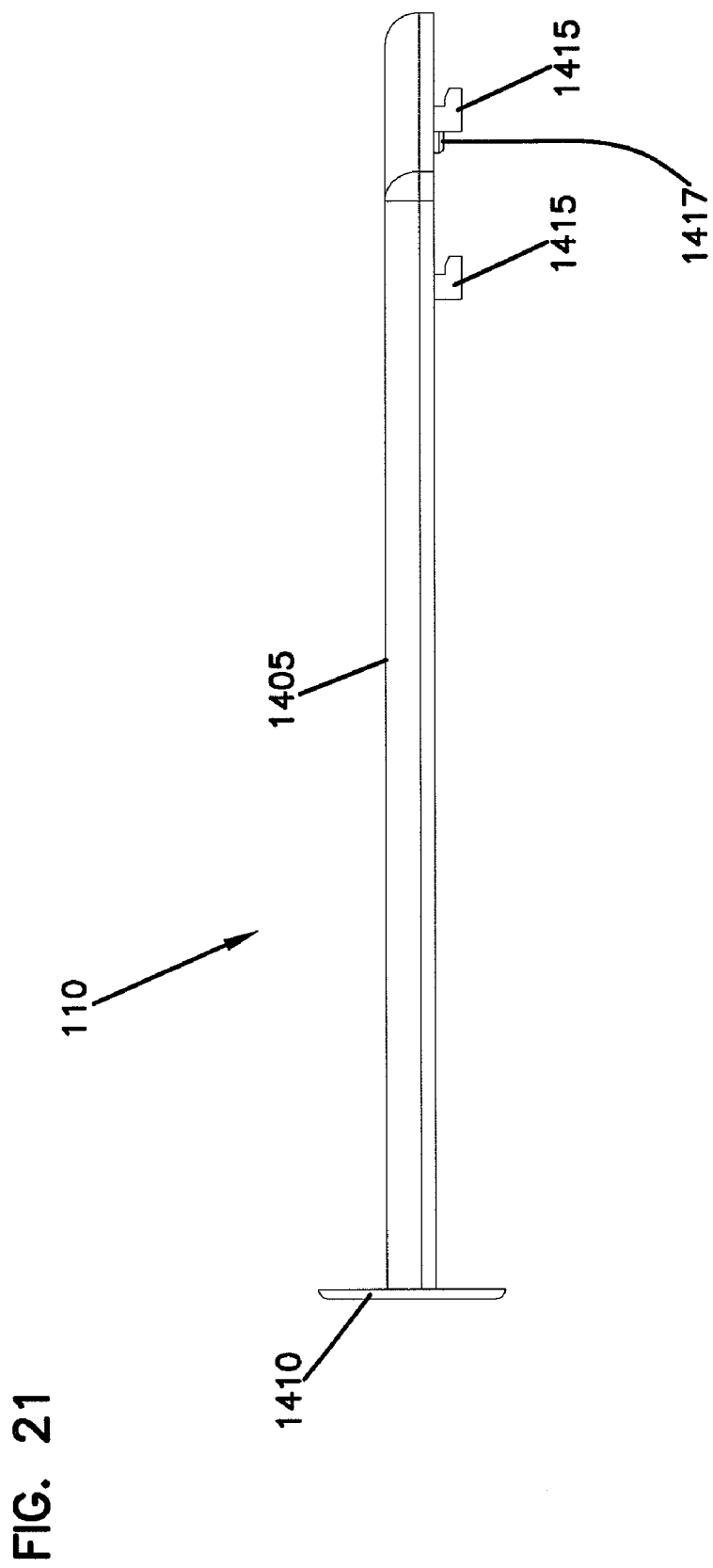
FIG. 21 is a top view of the patch cable finger unit of FIG. 16.

As referred to above, the cable management frame assembly 100 includes a plurality of cable management fixtures. In one example embodiment, a cable constraint bar 120 is provided, FIG. 4. The cable restraint bar 120 is a ring shaped structure 402 that includes a first opening 400 forming an opening into an interior of the ring shape. The first opening 400 is defined by a first end 405 and a second end 410. The second end 410 has a slight outward curvature. Connected to the cable restraint bar 120 is a pivot block 415. In the example embodiment, a portion of the cable restraint bar 120 is positioned through an internal passage defined in the body of the pivot block 415. The portion of the cable restraint bar positioned in the passage is loosely engaged to a surface of the passage. The cable restraint bar 120 is slidable relative to the pivot block 415 along an axis A. Additionally, the cable restraint bar 120 can be pivoted about the axis A and can be rotated in direction B about axis A. In the example embodiment a plurality of securing posts are integrally formed on a rear side of the pivot block 415. In one aspect, a plurality of L-shaped securing posts can be snapped into slit apertures 260 arranged on the primary surface 250 of the respective sides 210, 215 to fasten a respective cable restraint bar 120 to the frame chassis 105. As such, one or more cable restraint bars 120 can be mounted to the frame chassis 105 without the use of tools or additional hardware such screws, nuts or bolts. Additionally, the cable restraint bars 120 are removable and can be positioned on the frame chassis 105 as desired.

Cable restraint bars 120 are adjustable regarding how far front 412 extends forward of frame chassis 105 by sliding bar portion 414 relative to pivot block 415 forwardly or rearwardly. Cable restraint bars 120 are allowed to pivot to accommodate more or less cables. In the case of only a few cables, the ring shaped structure 402 pivots down to constrain the few cables. As the number of cables increases, ring shaped structure pivots up to increase the cable handling area. The ring shaped structure can be biased downwardly by a spring in block 415. In one embodiment the spring is a torsion type spring such that a downwardly acting restraining force is developed.

In one example embodiment, a plurality of cable management trays 125 are provided, as detailed in FIGS. 5-8. Each cable management tray 125 includes a horizontal positioning surface 500 having a plurality of apertures 505. In one aspect, the apertures 505 are positioned in a row and column configuration. Adjacent to a first edge 510 is a fin structure or front lip 515, having an aperture 517 formed therein, that extends perpendicularly from the horizontal positioning surface 500. Additionally, the cable management tray 125 includes a downwardly extending portion in the form of a curved lip member 520 adjacent to a first side 525 and an identical curved lip member 520 adjacent to a second side 530 of the horizontal positioning surface 500. Each respective curved lip member 520 extends generally in a direction opposite of the front lip 515.

In the example embodiment, the cable management tray 125 can be positioned into the elongated positioning aperture 235 positioned on the front plate 220 of respective sections 200, 205 of the frame chassis 105. A second edge 535, positioned oppositely from the first edge 510, of the cable management tray 125 is slidable into the elongated positioning aperture 235. The cable management tray 125 is secured into the elongated positioning aperture 235 via friction. Additionally, stop members 600 restrict sliding movement, and retain the cable management tray 125 in selected positions.

Additionally, the cable management trays 125 can be positioned to the frame chassis 105 by sliding the cable management tray 125 into a tray support structure that is secured to the frame chassis 105. For example, in one embodiment, each respective curved lip member 520 is engaged to a respective horizontal tray support 800 that is secured to the frame chassis 105. The cable management tray 125 is slidable into space 315. In the example embodiment, a pair of horizontal tray supports 800 are mounted to the frame chassis at an equal height such that a cable management tray 125 engaged with the supports 800 is horizontal with respect to a ground surface. The horizontal tray support 800 is a rigid molded structure that includes a U-shaped aperture 805 shaped to complement the shape of the curved lip member 520. The horizontal tray support 800 additionally includes a plurality of L-shaped securing posts 810 formed on a first surface 815 and a second surface 820. In this manner, the horizontal tray support 800 and can be snapped into complementary apertures on the frame chassis 105, such as the square apertures 255 arranged on the secondary surface 275 of the respective sides 210, 215. Upon fastening a pair of horizontal tray supports 800 at a desired level position on the secondary surface 275 of each respective side 210, 215, the curved lip members 520 of the cable management tray 125 are slid into horizontal tray supports 800 to mount the cable management tray 125 to the frame chassis 105. With this mounting arrangement, trays 125 can be mounted at a variety of desired vertical positions. The trays 125 can be fastened to a section of the frame chassis 105 without the use of tools or additional hardware such screws, nuts or bolts. Additionally, the trays 125 are removable and can be positioned on the frame chassis 105 as desired.

In one embodiment, a plurality of patch cable finger units 110 for cable management are provided, as detailed in FIGS. 16-21. In general, a patch cable finger unit 110 includes a base section 1400, one or more fingers 1405 extending from the base section 1400 in the same direction, a flange 1410 positioned on an end of each of the fingers 1405 opposite from the base section 1400, and a plurality of L-shaped securing posts 1415 arranged on a first side 1420 of the base section 1400.

In general, one or more patch cable finger units 110 can be positioned on one or both of the sides 210, 215 of the frame chassis 105 such that the flanges 1410 extend outwards from the front side 217 of the frame chassis 105. In this manner, one or more patch cables or other cables can be positioned between the fingers 1405 to manage and organize the cables as desired.

In one aspect, the plurality of L-shaped securing posts 1415 can be snapped into square apertures 255 arranged on the primary surface 250 of the respective sides 210, 215. In this manner, one or more respective patch cable finger units 110 can be fastened to a section of the frame chassis 105 without the use of tools or additional hardware such screws, nuts or bolts. In certain embodiments, a button 1417 is snapped into square apertures 255 arranged on the primary surface 250 to provide additional securing support to affix one or more patch cable finger units 110 to one or both of the sides 210, 215 of the frame chassis 105. In further embodiments, a button 1417 is positioned on pivot block 415, cable guide finger units 130 and panel mounts 1000 to provide additional securing support to affix one or more of fixtures to one or both of the sides 210, 215 of the frame chassis 105 in a similar manner to the patch cable finger units 110. Further, the patch cable finger units 110 are removable and can be positioned on the frame chassis 105 as desired.

Figure 22:
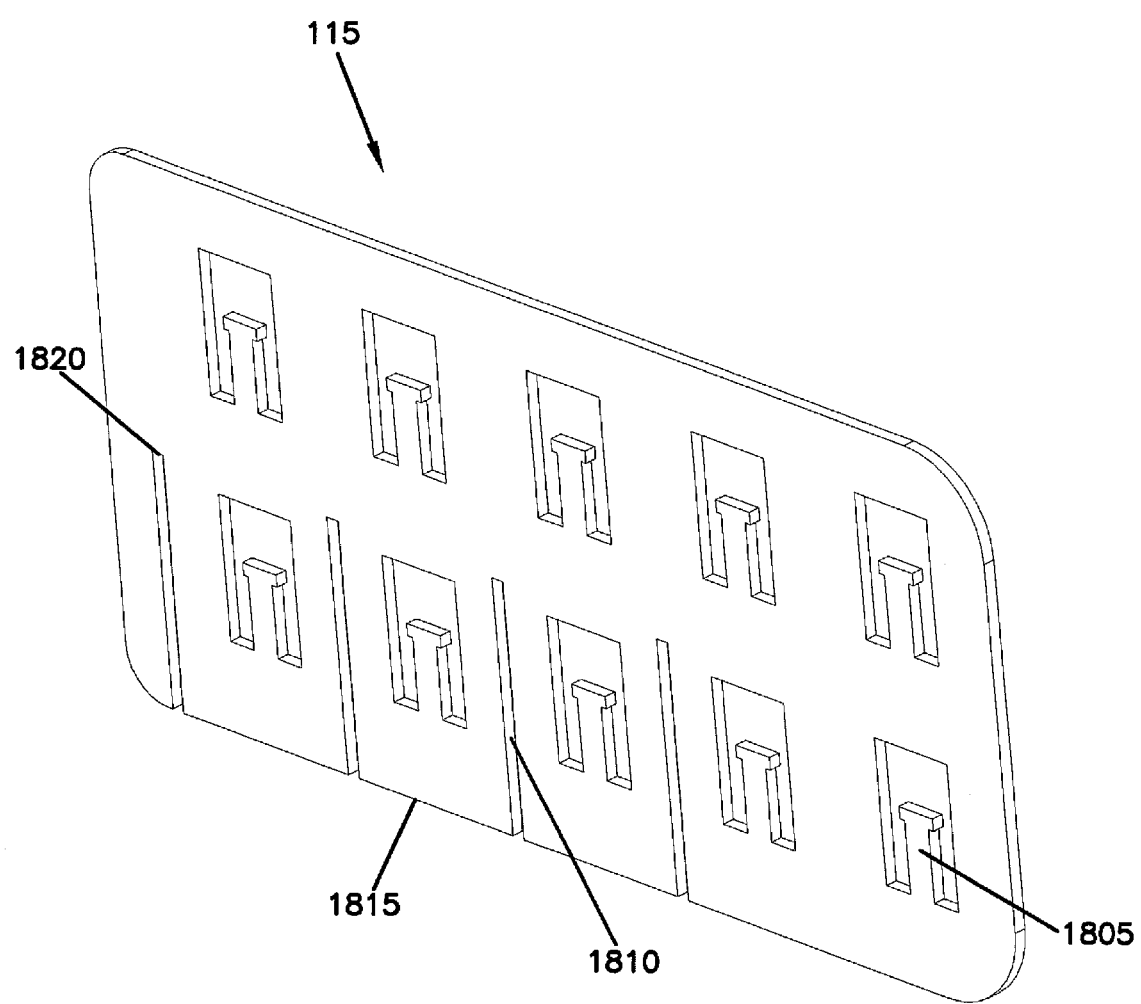
FIG. 22 is a perspective view of a cable management plate.

In one embodiment, a cable management plate 115 is provided, as detailed in FIG. 22. In general, the cable management plate 115 is rectangular in shape. The cable management plate 115 includes a plurality of tab member apertures 1805 that can be utilized as cable ties to secure or provide strain relief for one or more cables. In one embodiment, the tab member apertures 1805 are arranged in a row and column configuration.

The cable management plate 115 additionally includes a plurality of positioning slots 1810 periodically spaced between the columns of the flexible tab member apertures 1805. The positioning slots 1810 extend from a first edge 1815 and terminate at a generally internal position 1820 on the cable management plate 1800.

Figure 23:
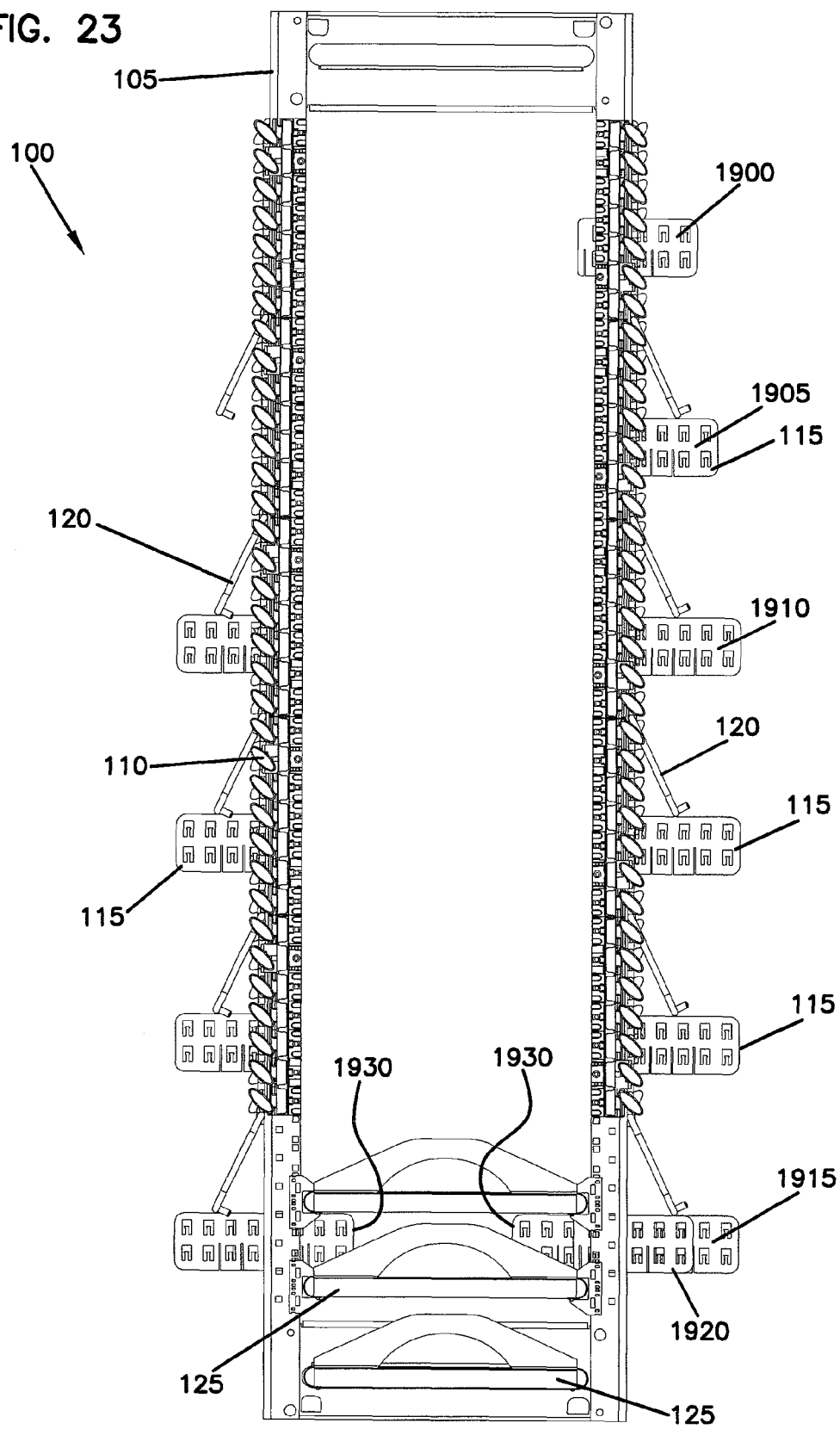
FIG. 23 is a front view of the example cable management frame assembly of FIG. 1, showing the cable management plates in different mounting positions.

In the example embodiment, one or more cable management plates 115 can be positioned in complementary features on the frame chassis 105. For example, a respective positioning slot 1810 can be positioned in a slot aperture 265 on the primary surface 250 of sides 210, 215. In this manner, a desired number of tab member apertures 1805 extend perpendicularly outwards from the primary surface 250 such that one or more cables can be managed and organized as desired. Curved tabs 261 restrict pivoting movement of the cable management plates 115. The cable management plates 115 can be positioned where a variable number cable ties and tab member apertures 1805 are utilized. One or more cable management plates 115 can be selectively positioned in a respective slot aperture 265 such that a desired number of tab member apertures 1805 are accessible inside or outside of frame chassis 105. For example, as shown in FIG. 23, six, eight or ten tab member apertures 1805 are accessible outside of frame chassis 105; see cable management plates 1900, 1905, 1910, respectively. Additionally, multiple cable management plates can be staggered front to back, see cable management plates 1915, 1920, in a respective slot aperture 265. Further, plates 1930 can be positioned so that tab member apertures 1805 are positioned inside of frame chassis 105. In this manner, one or more respective cable management plates 115 can be positioned to a portion of the frame chassis 105 without the use of tools or additional hardware such screws, nuts or bolts. Additionally, the one or more cable management plates 115 are removable and can be positioned on the frame chassis 105 as desired.

Figure 24:
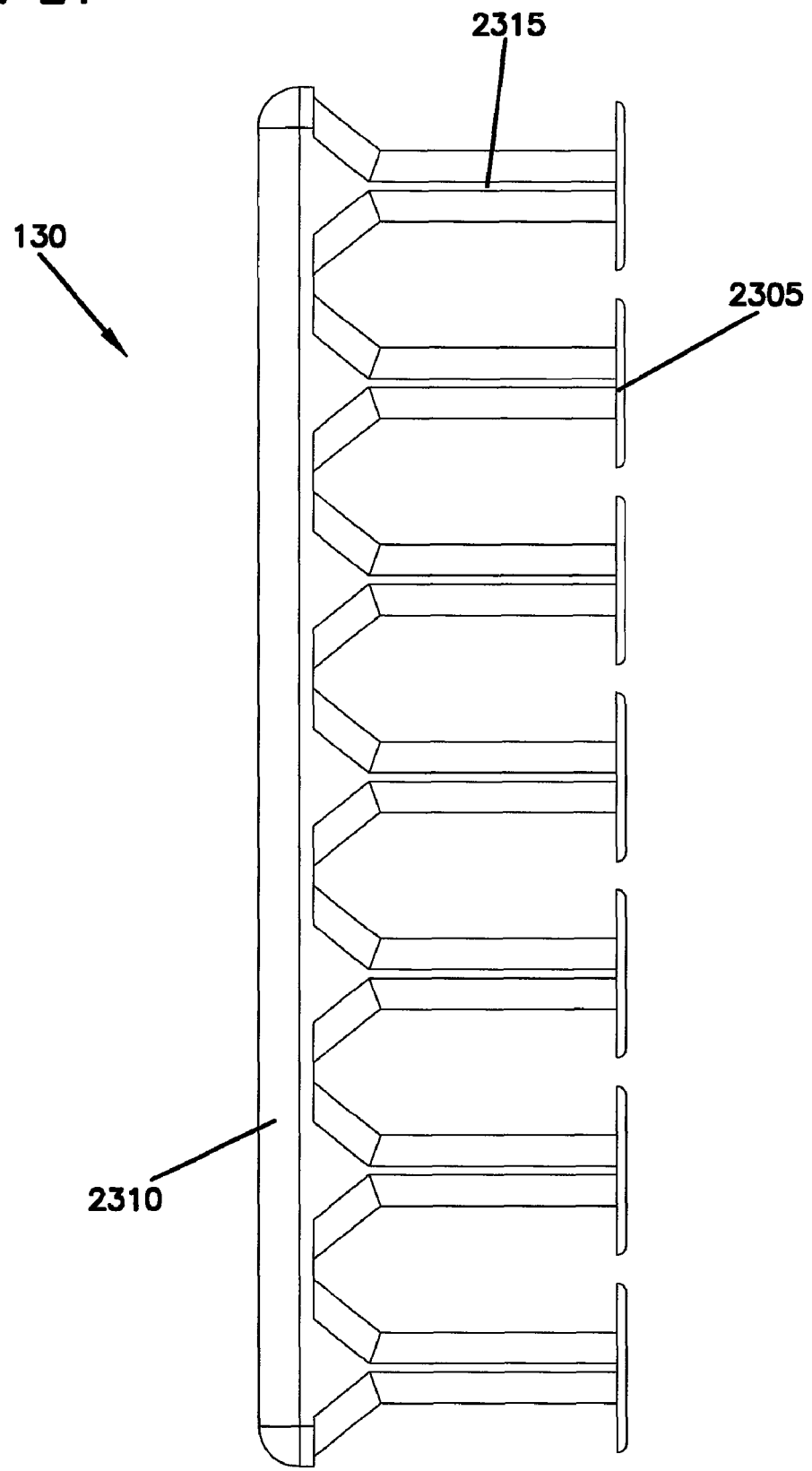
FIG. 24 is a side view of a cable guide finger unit.

In one embodiment, a plurality of cable guide finger units 130 are provided, as detailed in FIG. 24. In general, a cable guide unit 130 includes a base section 2310, one or more fingers 2315 extending from the base section 2310 in the same direction, a flange 2305 positioned on an end of each of the fingers 2315 opposite from the base section 2310, and a plurality of L-shaped securing posts 2320 arranged on a first side 2325 of the base section 2310.

Figure 25:
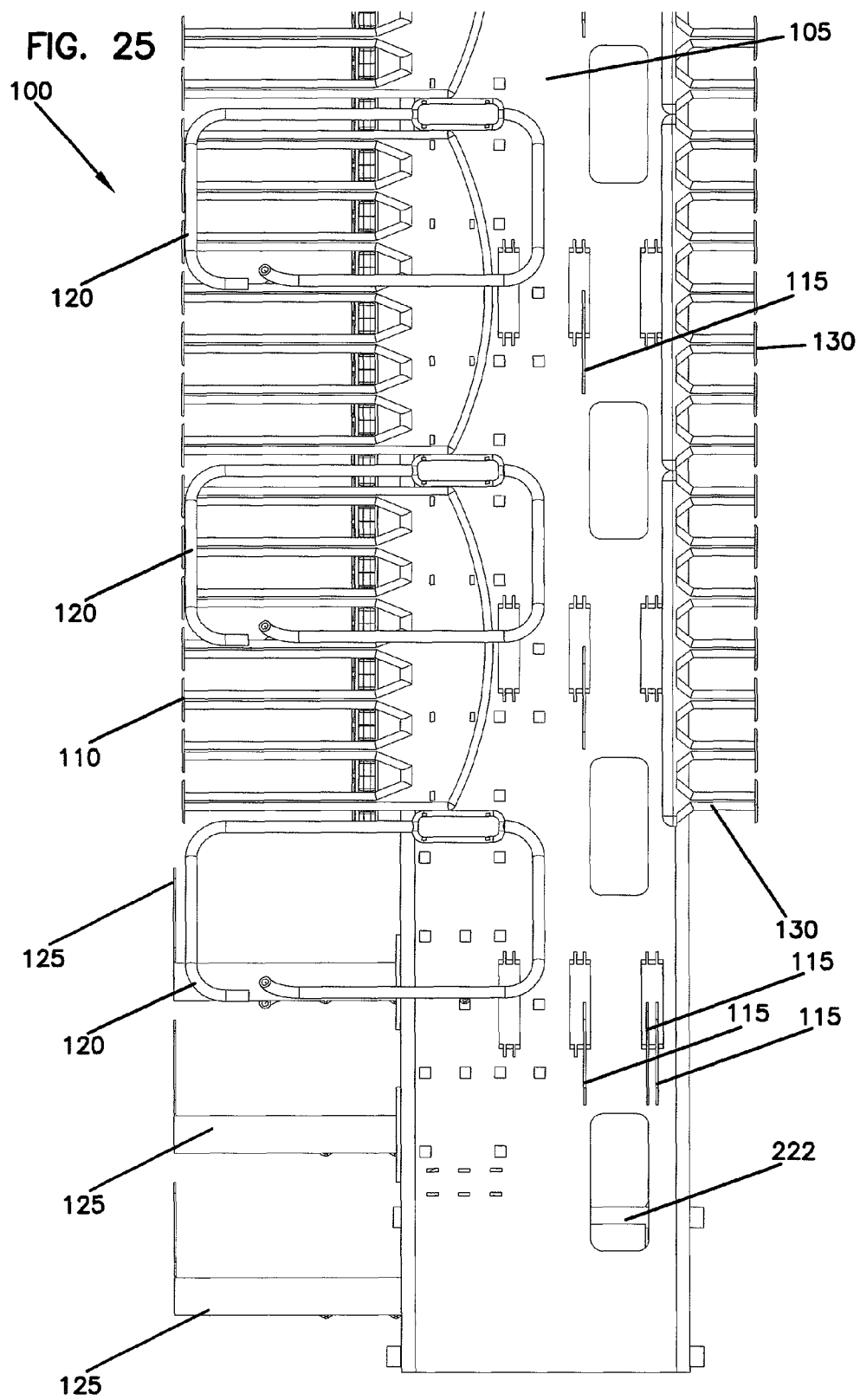
FIG. 25 is a side view of a bottom portion of the example cable management frame assembly of FIG. 1.
Figure 26:
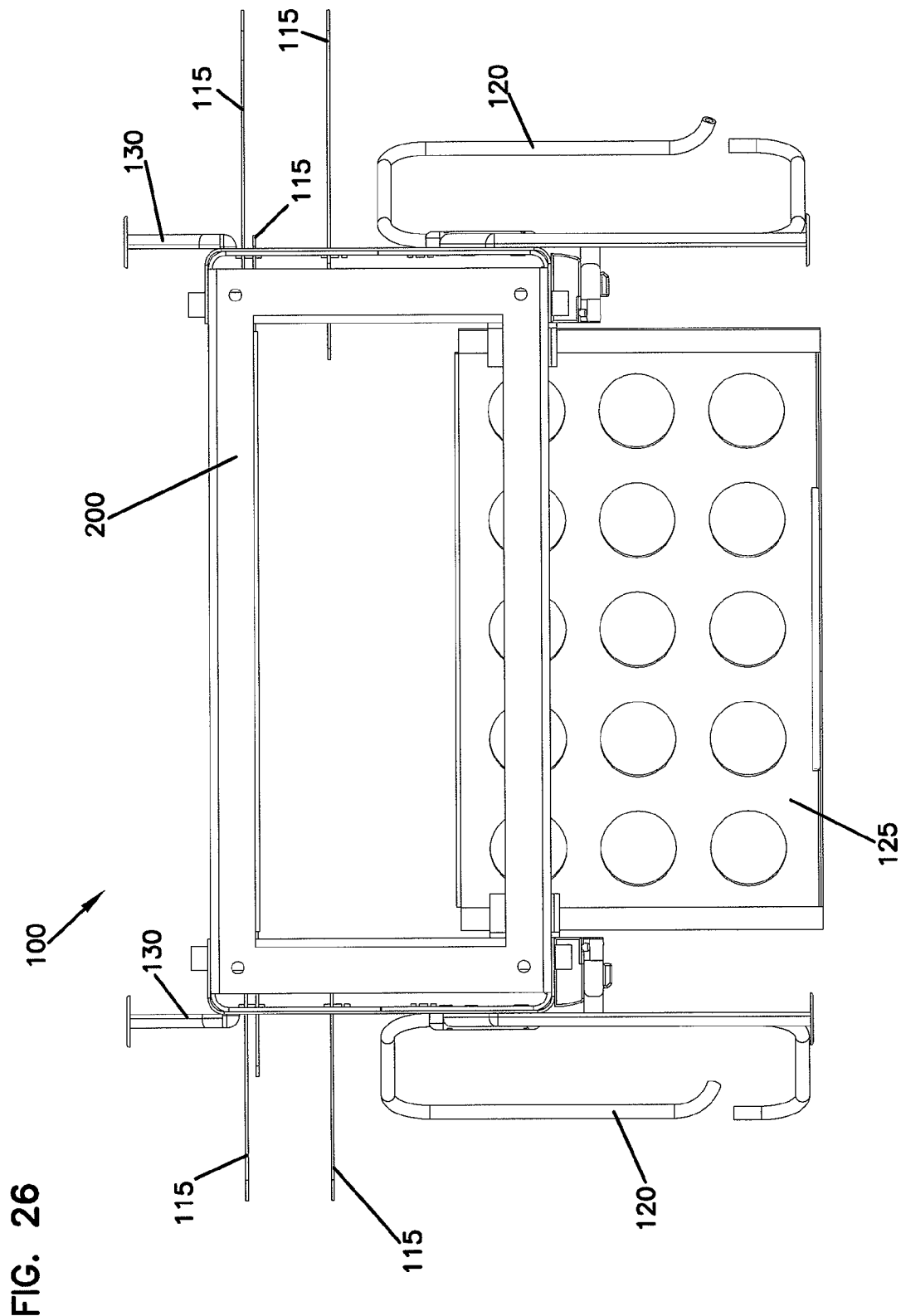
FIG. 26 is a top view of the example cable management frame assembly of FIG. 1.

In the example embodiment, one or more cable guide finger units 130 can positioned on one or both of the sides 210, 215 on a back side 219 of the frame chassis 105 such that the fingers 2315 are extended outwardly from a back side 219 of the frame chassis 105, FIG. 25. In this manner, one or more cables can be positioned between the fingers 2315 to support and organize cables as desired.

In one aspect, the plurality of L-shaped securing posts 2320 can be snapped into the square apertures 255 arranged on the secondary surface 275 of the respective sides 210, 215, to fasten a respective cable guide finger unit 130 to the frame chassis 105. As such, the one or more cable guide finger units 130 can be mounted to the frame chassis 105 without the use of tools or additional hardware such screws, nuts or bolts. In one embodiment, the cable guide finger units 130 are removable and can be positioned on the frame chassis 105 as desired.

Cable guide finger units 130 and patch cable finger units 110 are similar in structure and function. One difference is the cable guide finger units 130 are shorter in finger length than patch cable finger units 110. If desired, the individual fingers 1405, 2315 can be made to be moveably mounted to bases sections 1400, 2310, such as by retracting or extending longitudinally into or away from the respective base sections. The fingers can be retracted/extended as a group or individually.

The various fixtures, including the patch cable finger units 110, the cable management plates 115, the cable restraint bars 120, the cable management trays 125, the cable guide finger units 130, and the panel mounts 1000, can be delivered as separate elements with frame chassis 105, and mounted to frame chassis 105 after frame chassis 105 is erected from the collapsed state to the erected state. Alternatively, the various fixtures can be pre-mounted, and retracted, then extended into the desired positions after the frame chassis 105 is placed in the erected state.

Figure 27:
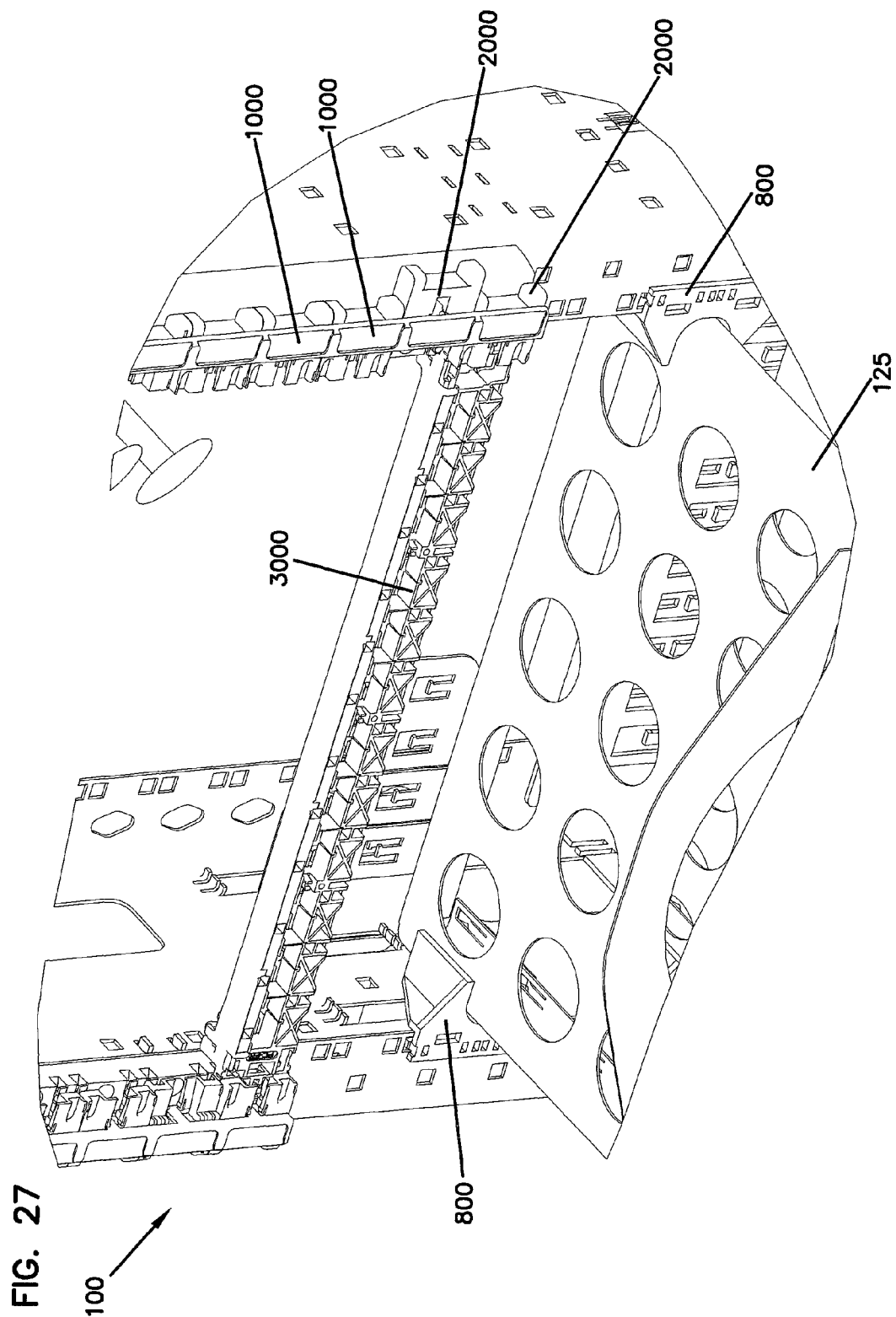
FIG. 27 is a further perspective view of a bottom portion of the example cable management frame assembly of FIG. 1, showing an example panel mounted to the frame chassis.
Figure 28:
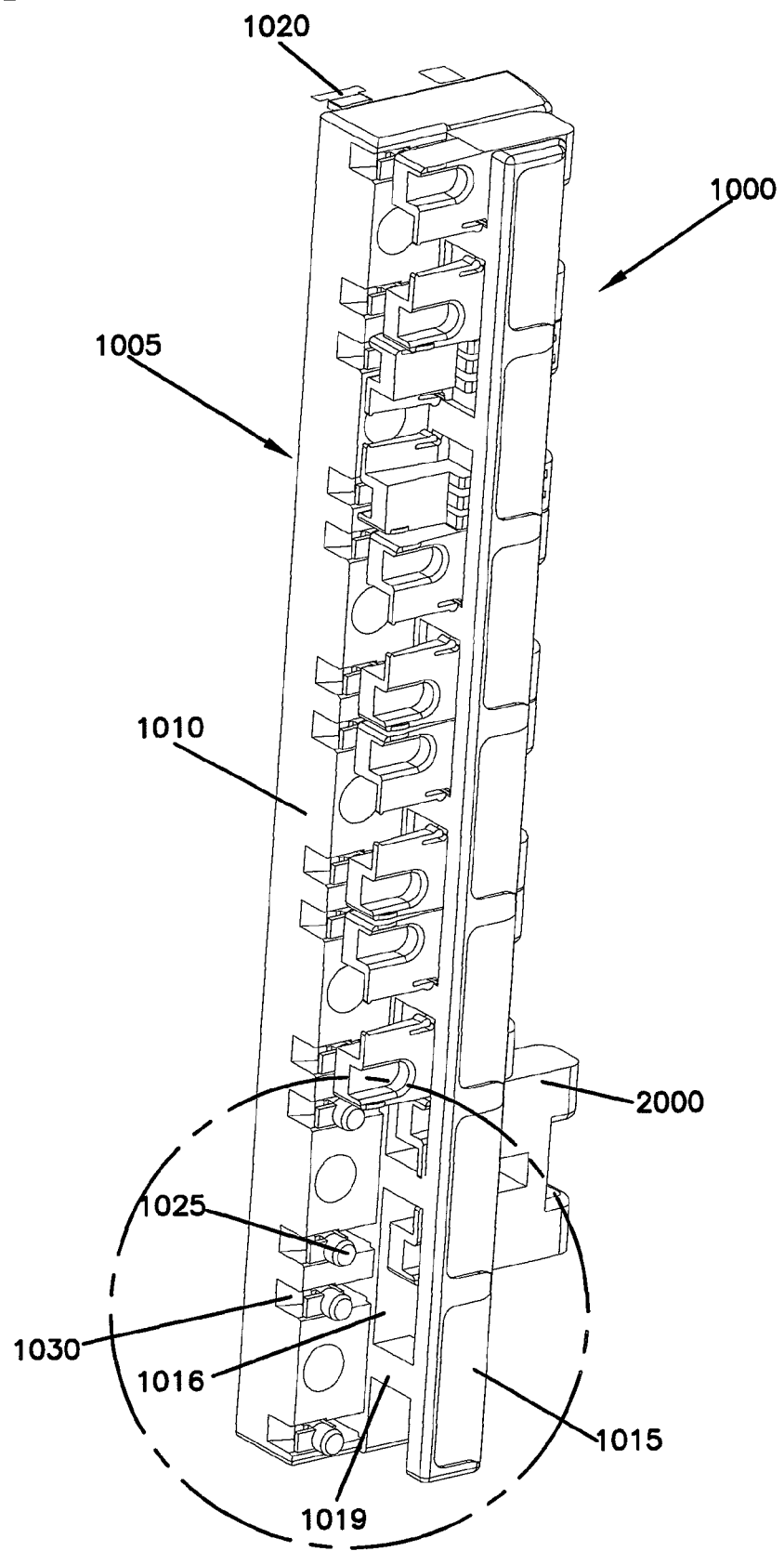
FIG. 28 is a perspective view of a panel mount unit, showing one retention wedge in the retracted position.
Figure 29:
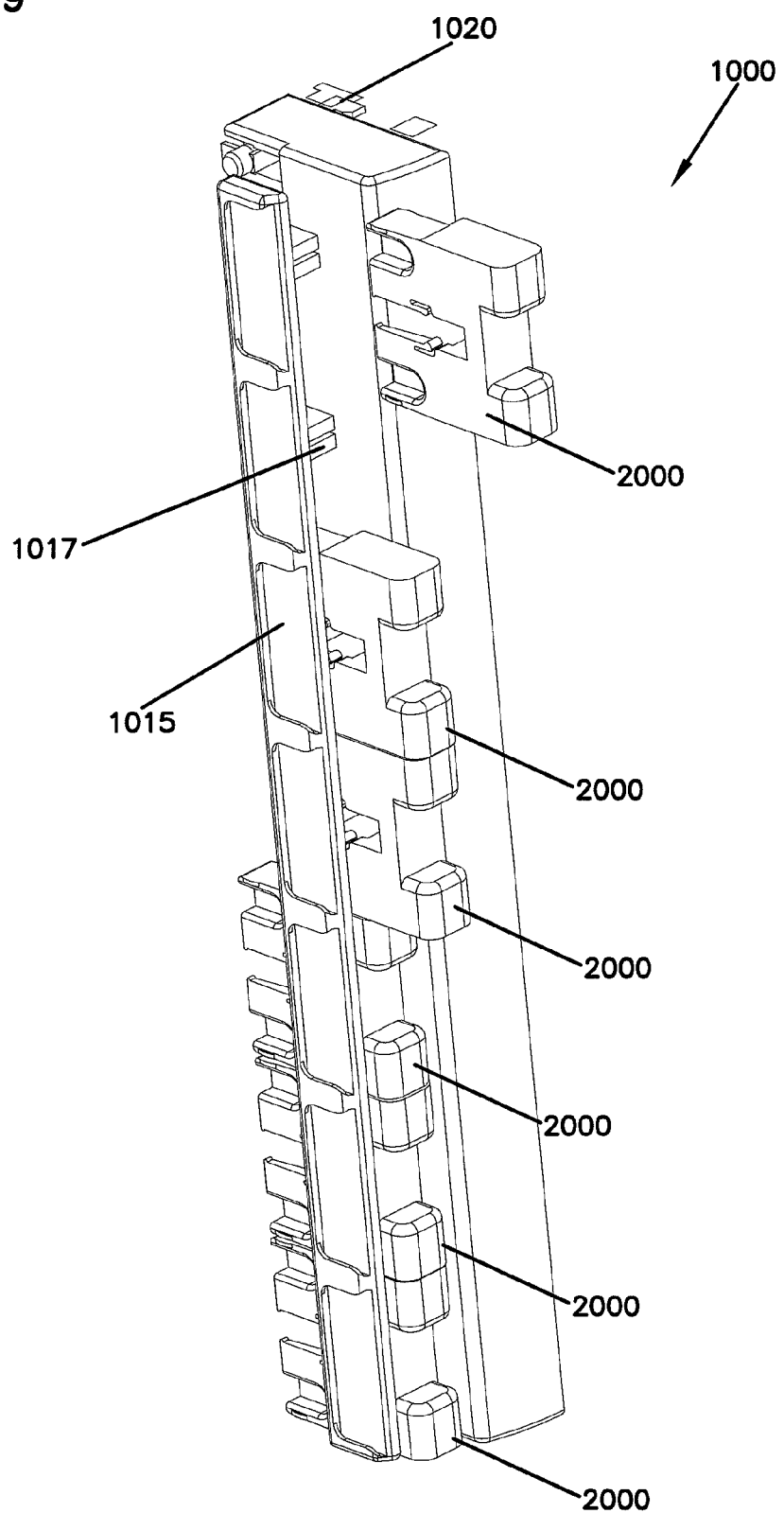
FIG. 29 is a further perspective view of the panel mount unit of FIG. 28, showing some of the retention wedges in refracted positions and one retention wedge in exploded view.
Figure 30:
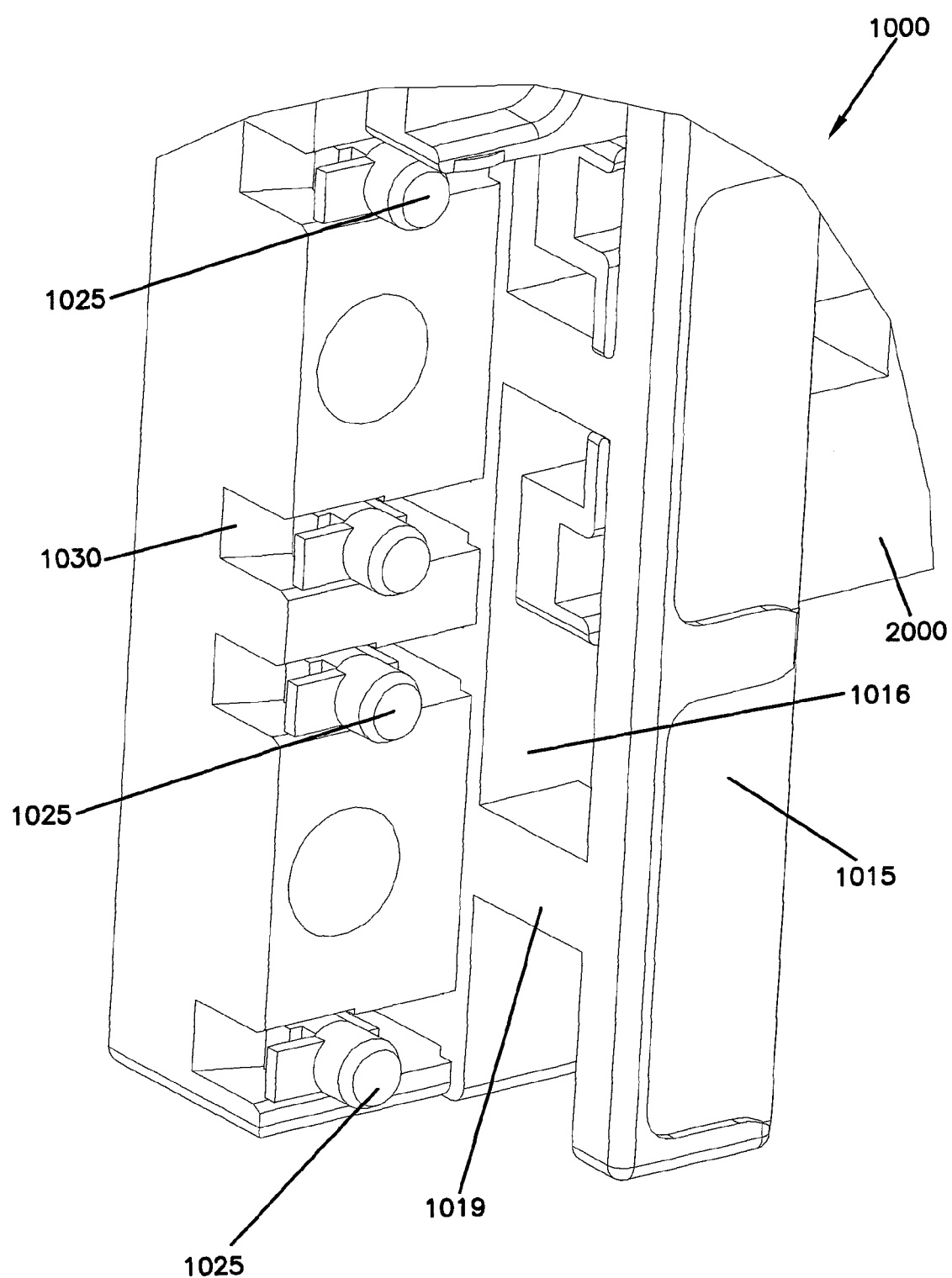
FIG. 30 is an enlarged perspective view of a portion of the panel mount unit of FIG. 28.
Figure 31:
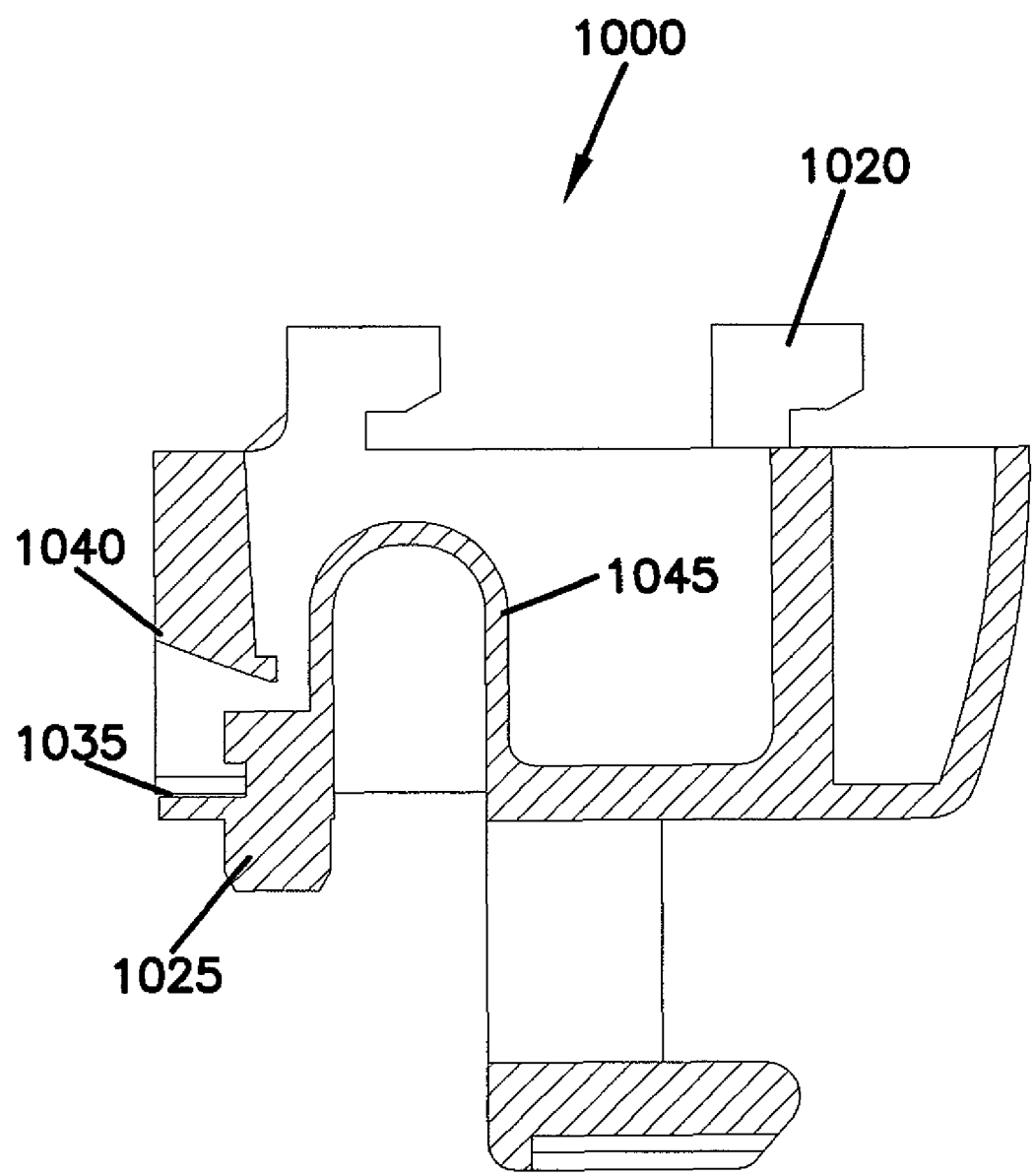
FIG. 31 is a cross-sectional view of the panel mount unit of FIG. 28 showing a panel stud in a mounting position.
Figure 32:
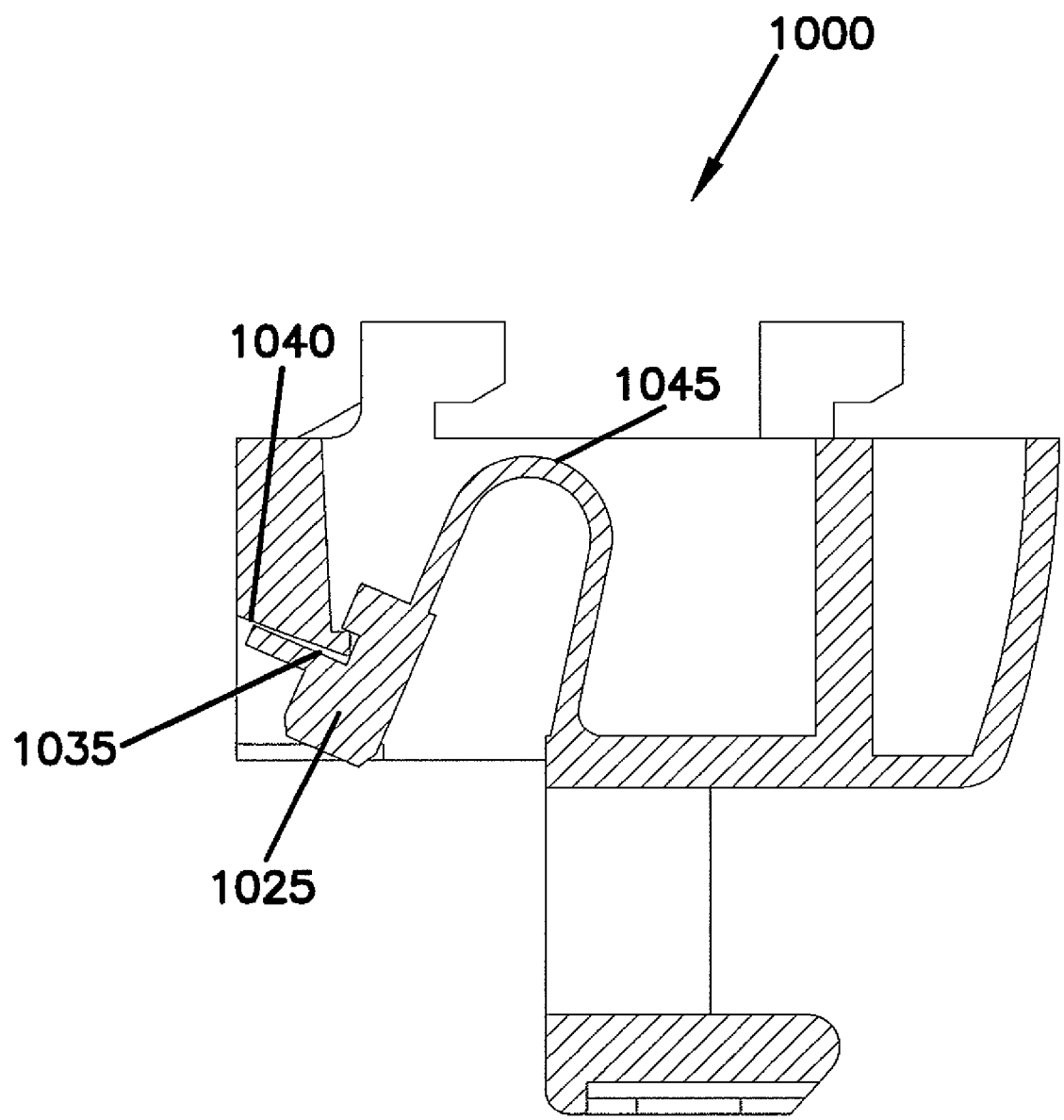
FIG. 32 is a cross-sectional view of the panel mount unit of FIG. 28 showing a panel stud in a displaced position.
Figure 33:
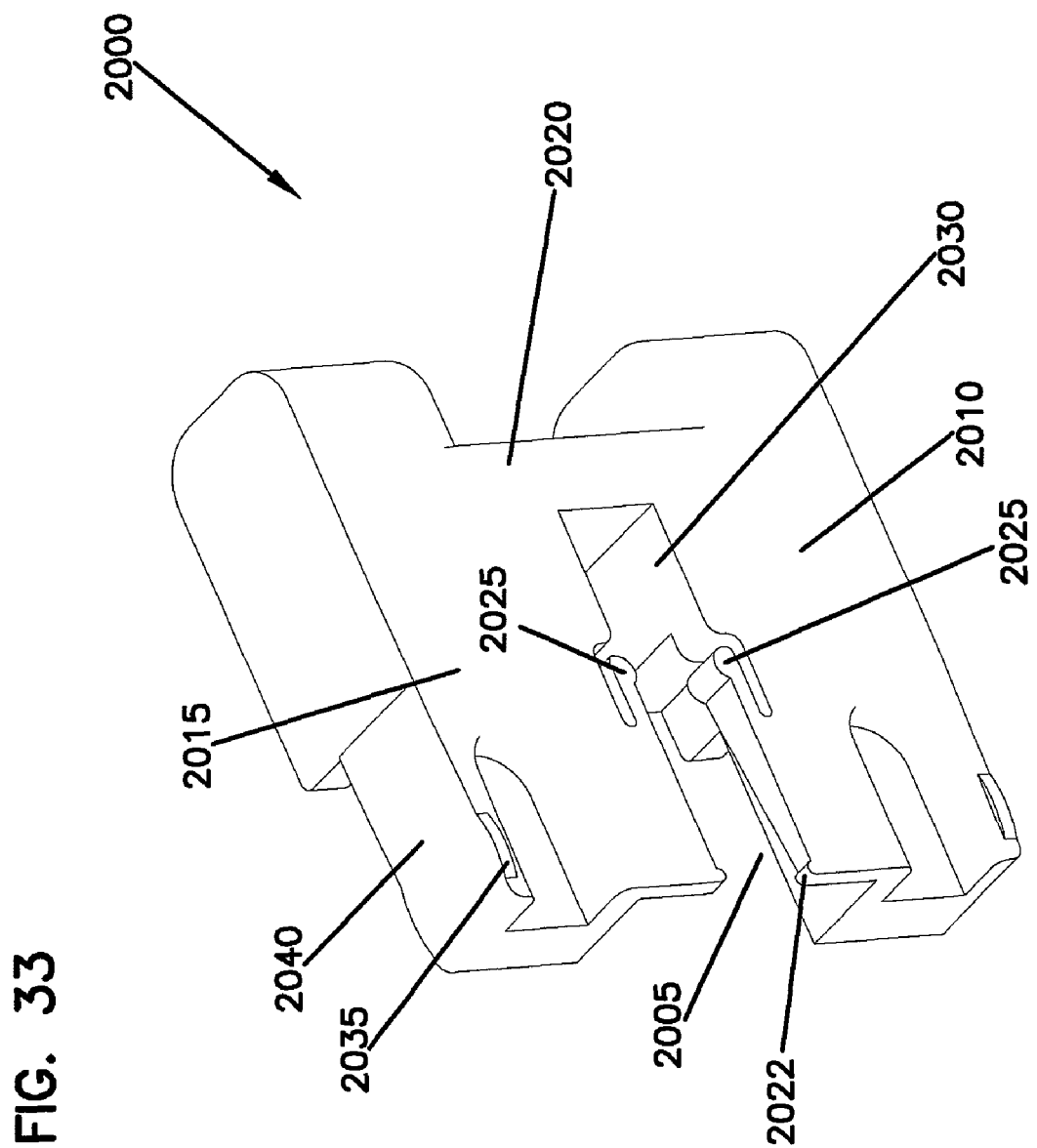
FIG. 33 is a perspective view of a retention wedge.

In one embodiment, a panel or equipment mounting assembly is provided for mounting equipment in space 315. The mounting assembly includes a panel mount 1000, and a retention wedge 2000 for mounting a panel 3000, FIG. 27. Referring now to FIGS. 28-33, the panel mount 1000 includes a first side 1005, a second side 1010, and a bracket 1015 extending outwardly from the second side 1010. The bracket 1015 includes a plurality of rectangular wedge member receiving apertures 1015, a stop surface 1017, and a clip surface 1019. The first side 1005 includes a plurality of clip posts 1020. The panel mount 1000 is secured to the secondary surface 275 of the frame chassis 105 by the clip posts 1020. The second side 1010 includes a plurality of panel studs 1025. Each respective panel stud 1025 is positioned in a respective stud aperture 1030. The panel stud 1025 is depressible upon a pressure applied to the panel stud 1025 to move the panel stud 1025 into the stud aperture 1030 until a stud first surface 1035 contacts a receiving stud surface 1040. A flexible tail 1045 biases each panel stud 1025 toward an outer position. The panel stud 1025 can be pushed inward if not desired and locked out of the way by pressing inward until the first stud surface 1035 contacts the receiving stud surface 1040. Such might be the case if equipment larger than one rack unit (1RU) is mounted the frame chassis 105.

The retention wedge 2000 includes a fitting aperture 2005 framed by a first wedge member 2010, a second wedge member 2015, and a stop bar 2020. A flexible retaining clip 2025 is positioned on an inner surface 2030 of the first wedge member 2010 and the second wedge member 2015. Additionally, a panel stud contact section 2035 is formed on an outer surface 2040 of both the first wedge member 2010 and the second wedge member 2015. Further, a retention bump 2022 is positioned at a terminal end of each respective retaining clip 2025 such that retention wedge 2000 does not fall from panel mount 1000 when not fully engaged. In one aspect, retention bump 2022 contacts a clip surface 1019 such that retention wedge 2000 does not fall from panel mount 1000 when not fully engaged.

Figure 34:
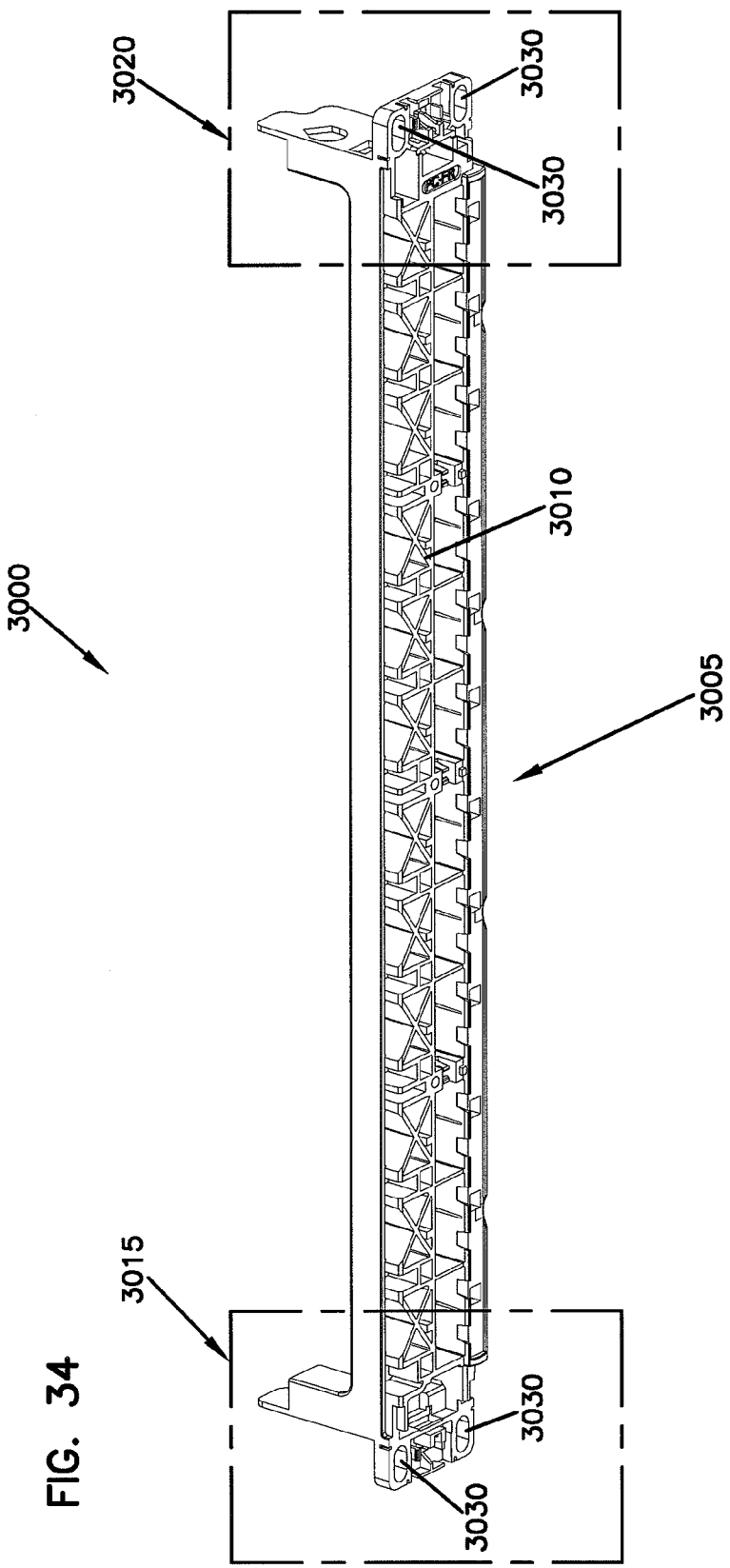
FIG. 34 is a perspective view of a panel.
Figure 35:
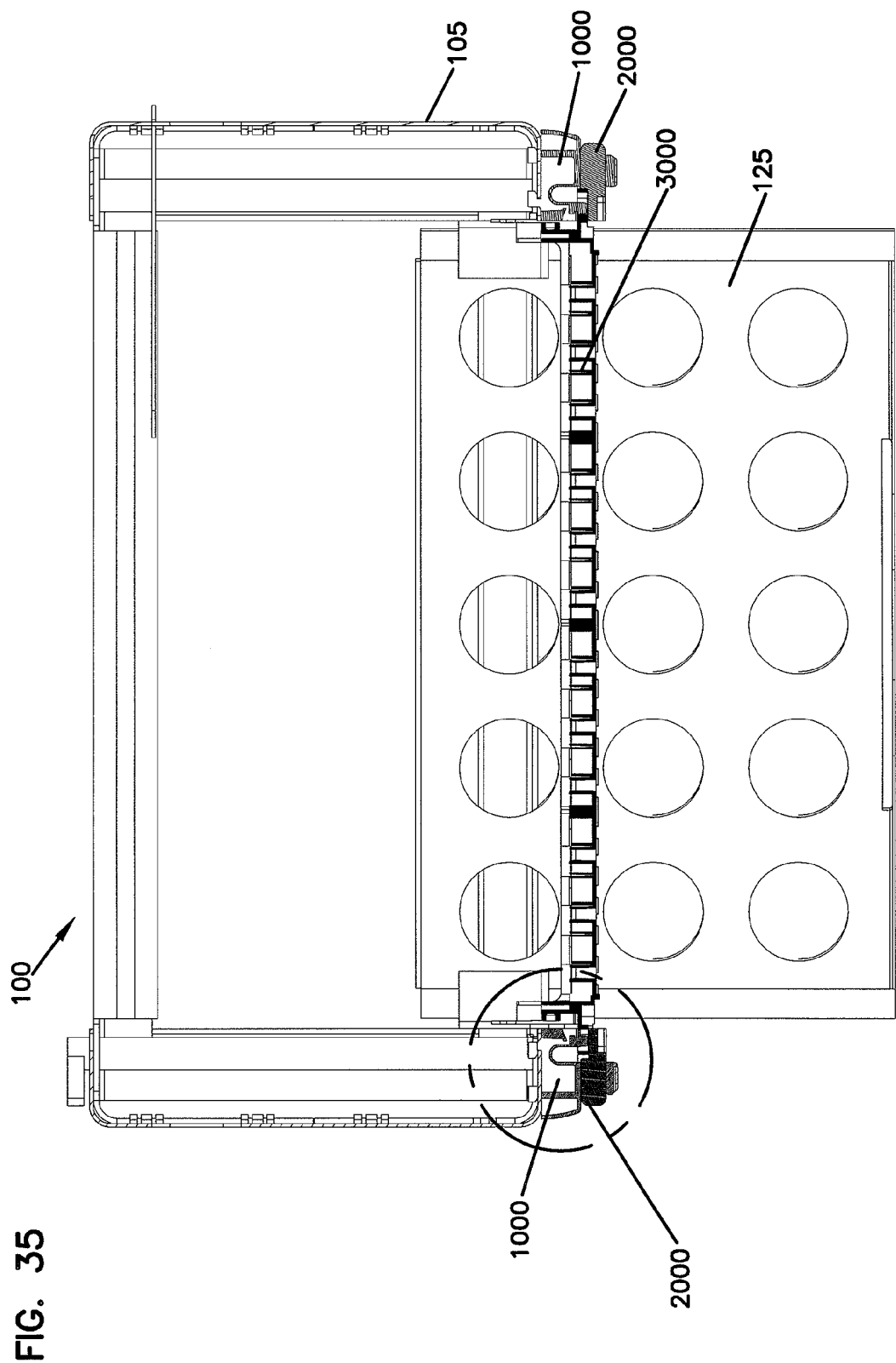
FIG. 35 is a top cross-sectional view of the example cable management frame assembly of FIG. 1 showing a mounted panel.
Figure 36:
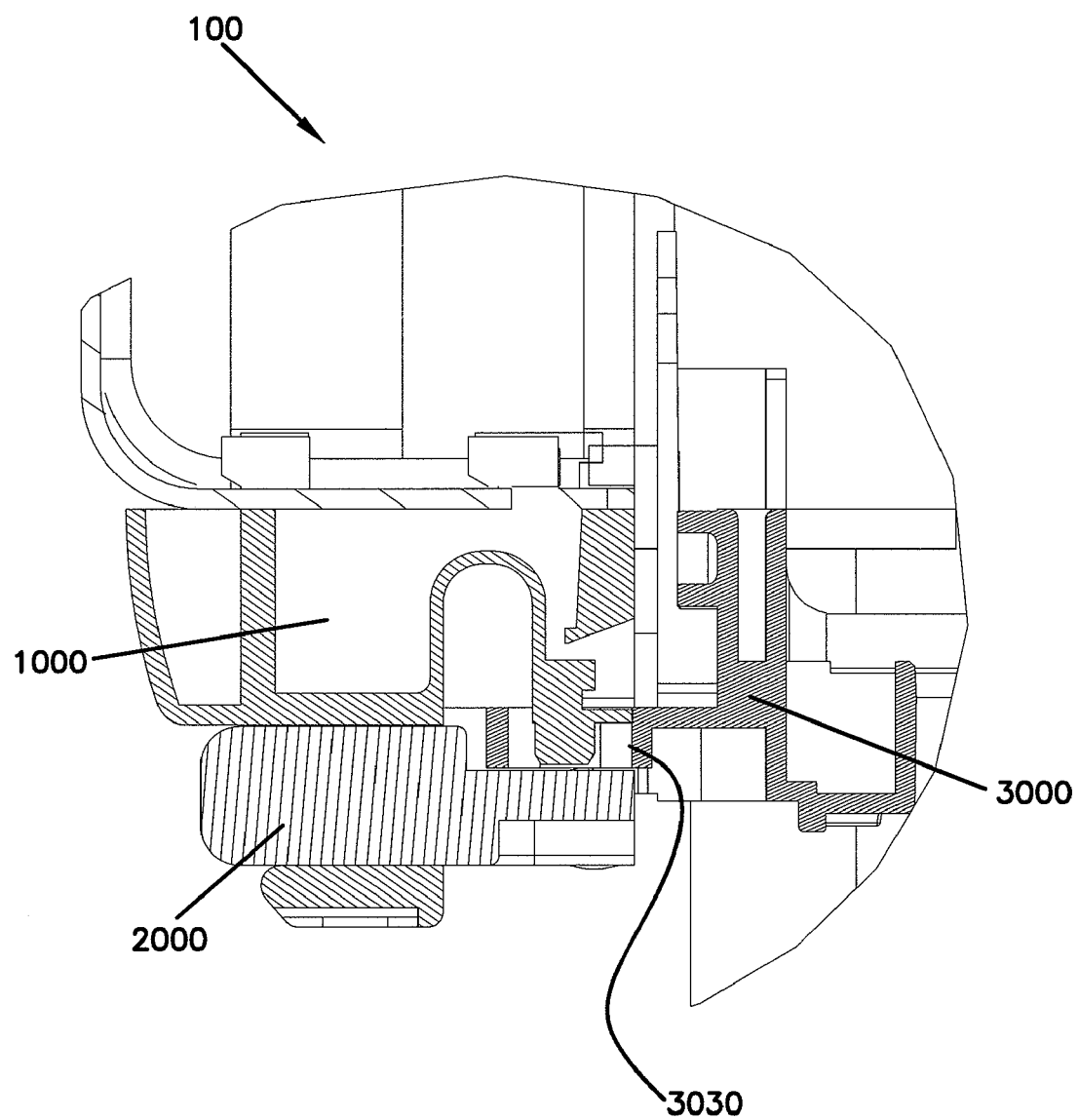
FIG. 36 is an enlarged view of a portion of FIG. 35.

Referring now to FIGS. 34-36, the panel 3000 includes a center section 3005 having a plurality of telecommunications connection locations 3010, such as for receiving copper or fiber connection equipment, including jacks or adapters. Located at each of a first end 3015 and a second end 3020 is a retaining flange 3025. The retaining flange 3025 includes a plurality of securing apertures 3030.

Figure 37:
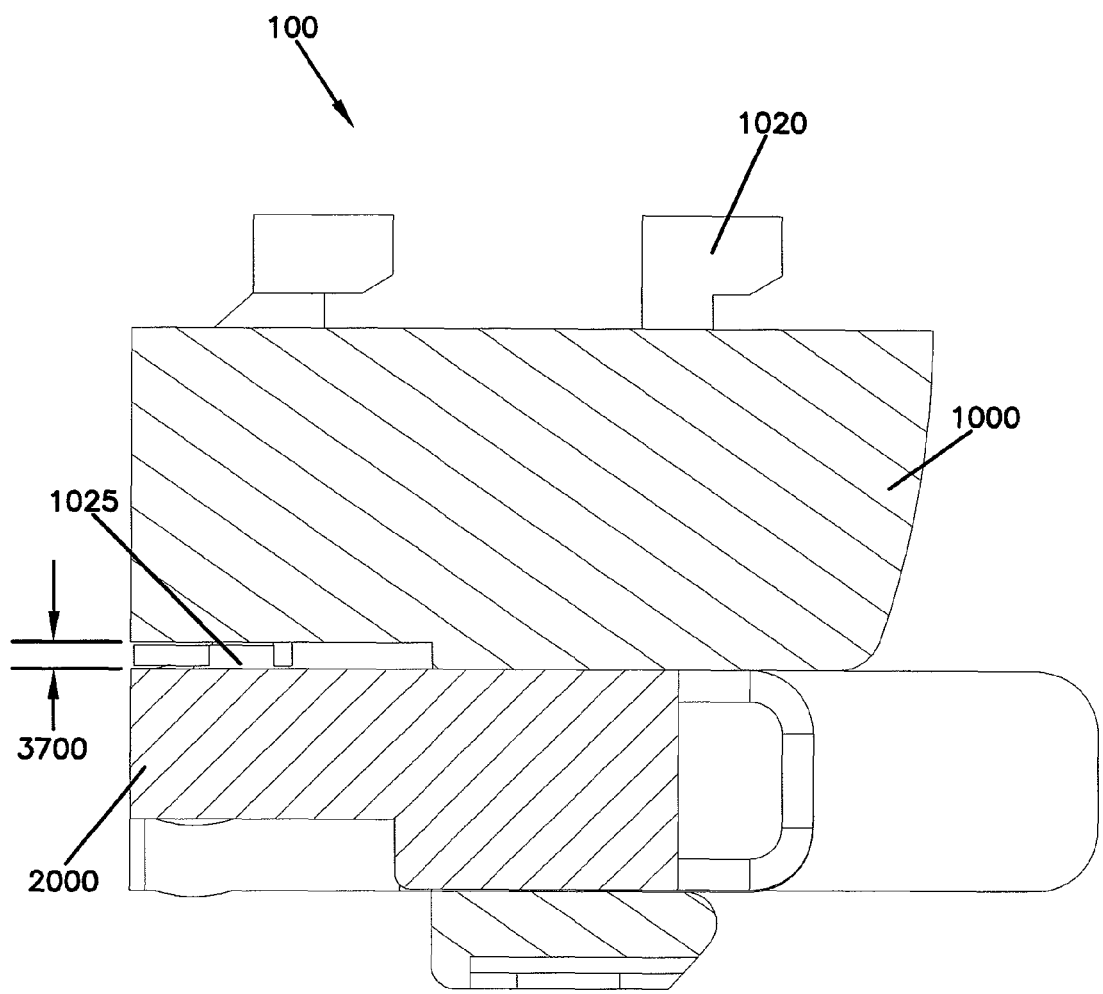
FIG. 37 is enlarged cross-sectional view of a portion of FIG. 35 showing a wedge positioned in a first orientation to secure a first panel having a first thickness.
Figure 38:
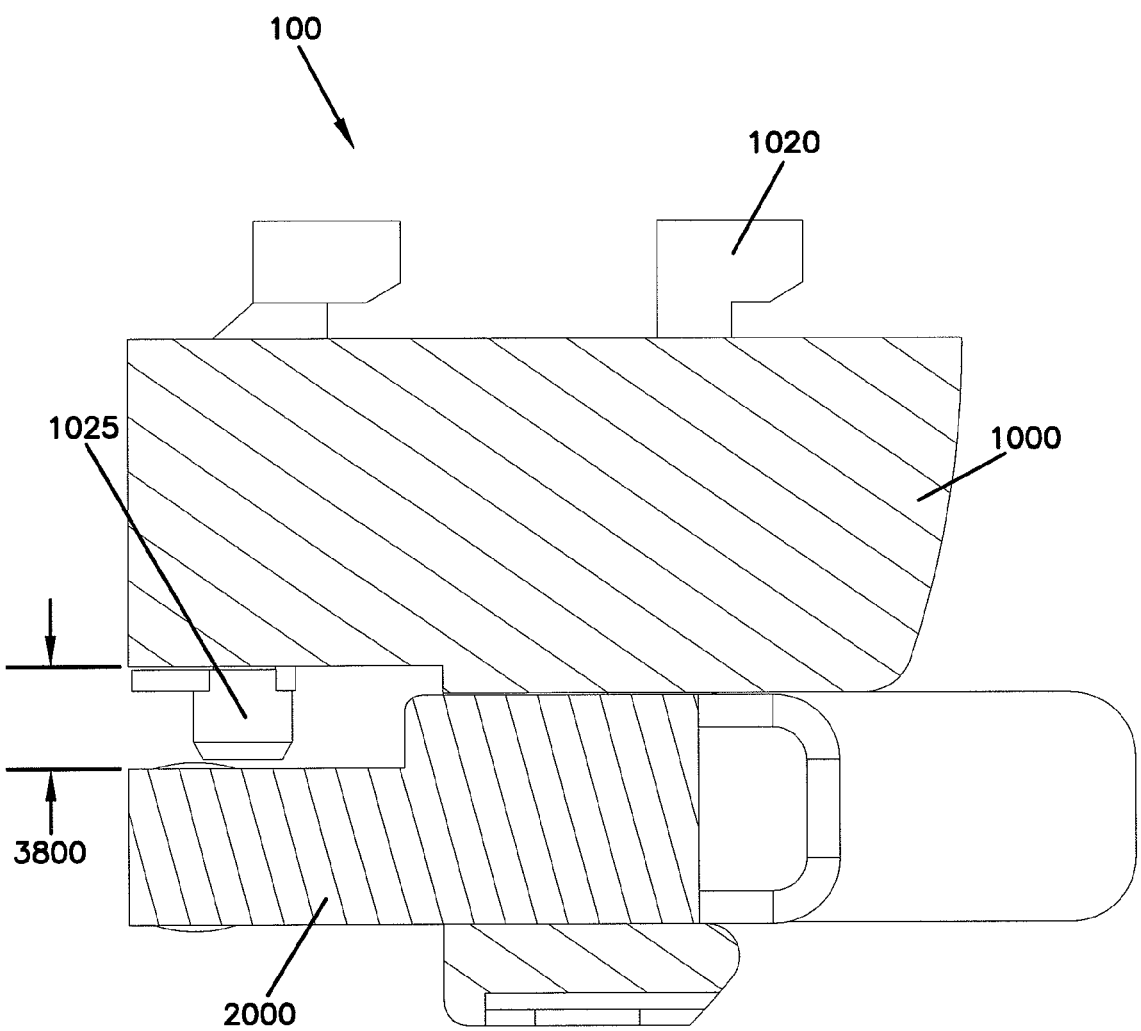
FIG. 38 is an enlarged cross-sectional view of a portion of FIG. 35 showing a wedge positioned in a second orientation to secure a second panel having a greater thickness than the first panel of FIG. 37.

In use, the panel 3000 is positioned to the panel mount 1000, that is secured to the secondary surface 275 of the frame chassis 105, such that each of the plurality of securing apertures 3030 are coincidentally aligned with a panel stud 1025. A retention wedge 2000 is positioned such that the first wedge member 2010 and the second wedge member 2015 are aligned with a respective wedge member receiving aperture 1015. The first wedge member 2010 and the second wedge member 2015 of the retention wedge 2000 are inserted into respective wedge member receiving apertures 1015 until the stop bar 2020 contacts the stop surface 1017. During the insertion process each of the flexible retaining clips 2025 are deformed outwardly, in a direction towards a panel stud contact section 2035 on the respective wedge member 2010, 2015. Upon contact of the stop bar 2020 with the stop surface 1017 each respective flexible retaining clip 2025 expands to its normal state and contacts the clip surface 1019. In this manner, the retention wedge 2000 is secured, thereby restraining the panel 3000 to the frame chassis 105. To disengage the retention wedge 2000 from the quick fit molding 1000 pressure is applied to deform each of the flexible retaining clips 2025. Wedges 2000 are reversible to allow for different panel thicknesses. In one aspect, the retention wedge 2000 is inserted into the bracket 1015 in a first orientation such that a first face is facing outwardly from the frame chassis 105. In a second aspect, the retention wedge 2000 is inserted into the bracket 1015 in a second orientation such that an opposite second face is facing outwardly from the frame chassis 105. For example, FIG. 37 illustrates a wedge 2000 inserted to panel mount 1000 in an orientation to allow for a first panel thickness, as illustrated by space 3700. In contrast, FIG. 38 illustrates a wedge 2000 reversed to allow for a greater panel thickness, as illustrated by space 3800.

The preceding embodiments are intended to illustrate without limitation the utility and scope of the present disclosure. Those skilled in the art will readily recognize various modifications and changes that may be made to the embodiments described above without departing from the true spirit and scope of the disclosure.

The invention claimed is:

1. A cable management frame assembly comprising:
   a frame chassis including: a top section, a bottom section, a first side, and a second side, and wherein the first side and the second side each include a primary surface and a secondary surface and each of the primary surface and the secondary surface includes a plurality of apertures; and
   a plurality of cable restraint bars, each cable restraint bar including:
      a ring shaped body defining a through-opening and having an opening defined by two ends of the ring shaped body that provides access to the through-opening from an exterior of the ring shaped body, the ring shaped body being pivotally moveable relative to the frame chassis;
      a pivot block mounted to the ring shaped body; and
      a plurality of securing posts arranged on a rear side of the pivot block, the securing posts mounted to the plurality of apertures,
   wherein each cable restraint bar pivots down to decrease a cable handling area that extends between the ring shaped body and the frame chassis and pivots up to increase the cable handling area.

2. The cable management frame assembly of claim 1, wherein the cable restraint bar is slidable along a longitudinal axis in a direction parallel to the primary surface.

3. The cable management frame assembly of claim 2, wherein the cable restraint bar is pivotable with respect to the longitudinal axis.

4. The cable management frame assembly of claim 1, wherein the plurality of apertures includes at least a plurality of square apertures.

5. The cable management frame assembly of claim 4, wherein the plurality of securing posts arranged on the rear side of the pivot block are snapped into the square apertures.

6. The cable management frame assembly of claim 4, wherein the cable restraint bars are removable from the frame chassis.

7. The cable management frame assembly of claim 1, further comprising:
   a plurality of cable management finger units including:
      a base section;
      a plurality of fingers extending in a common direction from the base section;
      a flange positioned on an end of each of the fingers opposite from the base section; and
      a plurality of securing posts arranged on the base section and mounted to the plurality of apertures.

8. The cable management frame assembly of claim 7, wherein a plurality of finger units are positioned on the primary surface of at least one of the first side and the second side, and wherein the fingers of each of the finger units extend outwards from a front side of the frame chassis.

9. The cable management frame assembly of claim 1, further comprising:
   a plurality of management plates including:
      a plate body;
      a plurality of tab members for cable ties; and
      a plurality of positioning slots wherein one of the slots is mounted to one of the apertures.

10. The cable management frame assembly of claim 9, wherein the tab members are arranged in a plural row and column configuration.

11. The cable management frame assembly of claim 9, wherein the positioning slots are spaced between the columns of the tab members.

12. A cable management frame assembly comprising:
    a frame chassis including: a top section, a bottom section, a first side, and a second side, and wherein the first side and the second side each include a primary surface and a secondary surface and each of the primary surface and the secondary surface includes a plurality of apertures; and
    a cable restraint bar including:
       a ring shaped body having an opening, the ring shaped body being pivotally moveable up and down relative to the frame chassis;
       a pivot block mounted to the ring shaped body; and
       a plurality of securing posts arranged on a rear side of the pivot block, the securing posts mounted to the plurality of apertures,
    a plurality of cable management trays including:
    a main support surface;
    a front structure extending perpendicularly from a first edge of the main support surface; and
    two downwardly extending members, wherein a first member is positioned on a first side adjacent to the main support surface and a second member is positioned on a second side adjacent to the main support surface, and wherein the members extend generally in direction opposite of the front structure; and
    a plurality of horizontal tray supports for receiving the downwardly extending members, wherein each of the plurality of horizontal tray supports have a first surface and a second surface, and wherein a plurality of securing posts are formed on the first surface and the second surface and mounted to the plurality of apertures.

13. The cable management frame assembly of claim 12, wherein a further cable management tray is positioned in an elongated positioning aperture formed in a front plate of at least one of the top section and the bottom section of the frame chassis.

14. The cable management frame assembly of claim 12, wherein the trays are slideably mounted to the tray supports.

15. The cable management frame assembly of claim 14, further comprising a plurality of tray stops to selectively locate the trays in discrete positions relative to the tray supports.

* * * * *

UNITED STATES PATENT AND TRADEMARK OFFICE
CERTIFICATE OF CORRECTION

PATENT NO.      : 8,307,996 B2
APPLICATION NO. : 12/547775
DATED           : November 13, 2012
INVENTOR(S)     : Taylor It is certified that error appears in the above-identified patent and that said Letters Patent is hereby corrected as shown below:

In the Specification

Col. 2, line 60: "refracted positions and" should read --retracted positions and--

Signed and Sealed this
Fifth Day of November, 2013

Teresa Stanek Rea
*Deputy Director of the United States Patent and Trademark Office*